United States Patent
Lin

(10) Patent No.: US 9,831,924 B2
(45) Date of Patent: Nov. 28, 2017

(54) NON-CONTACT COMMUNICATION APPARATUS AND SYSTEM USING THE SAME

(71) Applicant: Renesas Electronics Corporation, Tokyo (JP)

(72) Inventor: Xihua Lin, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/072,389

(22) Filed: Mar. 17, 2016

(65) Prior Publication Data

US 2016/0294449 A1 Oct. 6, 2016

(30) Foreign Application Priority Data

Mar. 30, 2015 (JP) ................................. 2015-068410
Sep. 15, 2015 (JP) ................................. 2015-181616

(51) Int. Cl.
*H04B 5/00* (2006.01)
*H04M 1/00* (2006.01)
(Continued)

(52) U.S. Cl.
CPC ............ *H04B 5/0081* (2013.01); *H02J 50/12* (2016.02); *H04B 5/0031* (2013.01);
(Continued)

(58) Field of Classification Search
CPC .... H01F 27/367; H01F 41/00; H01F 27/2885; H01L 23/5223; H01L 23/5225; H01L 23/5227; H01L 23/645; H01L 23/66; H01L 28/10; H01L 23/585; H01L 29/0619; H02J 50/12; H03H 7/0153; H03H 7/09; H03H 7/1766; H03H 7/42; H03H 11/126; H04B 1/1036; H04B 1/109; H04B 5/0031; H04B 5/0037; H04B 5/0056; H04B 5/0062; H04B 5/0075; H04B 5/0081; H04B 5/0087; H04K 1/0219; H04K 1/115; H04K 1/181; H04K 2201/10015; H04K 2201/1003;
(Continued)

(56) References Cited

U.S. PATENT DOCUMENTS 6,380,567 B1 * 4/2002 Okitaka ............ H01L 21/76838
257/211
2004/0178472 A1 * 9/2004 Zhang ................... H01L 23/552
257/531
(Continued)

FOREIGN PATENT DOCUMENTS

JP 2014-53813 A 3/2014
JP 2015-175480 A 10/2015

*Primary Examiner* — Yuwen Pan
*Assistant Examiner* — Paul P Tran
(74) *Attorney, Agent, or Firm* — Mattingly & Malur, PC

(57) ABSTRACT

An apparatus including a board, an inductor that is provided on the board, a guard ring that includes a first guard ring part provided to be adjacent to a circumference of the inductor and a second guard ring part provided to be adjacent to an outer side of the first guard ring part, in which one end of the second guard ring part is connected to one end of the first guard ring part, and a first power supply that is connected to another end of the first guard ring part and another end of the second guard ring part.

18 Claims, 19 Drawing Sheets

(51) Int. Cl.
| | |
|---|---|
| *H01L 29/66* | (2006.01) |
| *H01L 27/08* | (2006.01) |
| *H01L 21/02* | (2006.01) |
| *H01L 23/48* | (2006.01) |
| *H01L 23/52* | (2006.01) |
| *H01L 29/40* | (2006.01) |
| *H04B 3/28* | (2006.01) |
| *H03H 7/01* | (2006.01) |
| *H03H 5/00* | (2006.01) |
| *H01F 29/02* | (2006.01) |
| *H01F 21/08* | (2006.01) |
| *H05K 1/02* | (2006.01) |
| *H05K 1/18* | (2006.01) |
| *H05K 1/11* | (2006.01) |
| *H02J 50/12* | (2016.01) |

(52) U.S. Cl.
CPC ......... *H04B 5/0037* (2013.01); *H04B 5/0062* (2013.01); *H04B 5/0087* (2013.01); *H05K 1/0219* (2013.01); *H05K 1/115* (2013.01); *H05K 1/181* (2013.01); *H05K 2201/1003* (2013.01); *H05K 2201/10015* (2013.01); *H05K 2201/10098* (2013.01); *H05K 2201/10287* (2013.01); *H05K 2201/10545* (2013.01)

(58) Field of Classification Search
CPC ... H04K 2201/10098; H04K 2201/102; H05K 1/0219; H05K 1/115; H05K 1/181

USPC ....... 455/41.1, 41.2, 334, 519, 552.1, 556.1, 455/569.1, 575.2, 62; 257/531; 320/108; 333/12, 172, 175, 25; 336/142, 155, 336/84 C, 84 M; 340/14.63; 375/350
See application file for complete search history.

(56) References Cited

U.S. PATENT DOCUMENTS

| | | | |
|---|---|---|---|
| 2005/0051869 A1* | 3/2005 | Watanabe ........... | H01L 23/5227 257/531 |
| 2005/0247999 A1* | 11/2005 | Nishikawa .......... | H01L 23/5225 257/531 |
| 2009/0033467 A1* | 2/2009 | Finocchiaro ............. | H04B 5/00 340/10.1 |
| 2010/0200921 A1* | 8/2010 | Fuchigami .......... | H01L 27/0251 257/358 |
| 2013/0093047 A1* | 4/2013 | Huang ................ | H01L 23/5223 257/532 |
| 2014/0073243 A1 | 3/2014 | Hijioka et al. | |
| 2015/0108357 A1* | 4/2015 | Rose .................... | H01L 23/552 250/370.09 |
| 2015/0130552 A1* | 5/2015 | Bhagat ................... | H01F 38/14 333/12 |
| 2015/0302976 A1* | 10/2015 | Chang ................ | H01L 23/5227 336/84 M |

\* cited by examiner

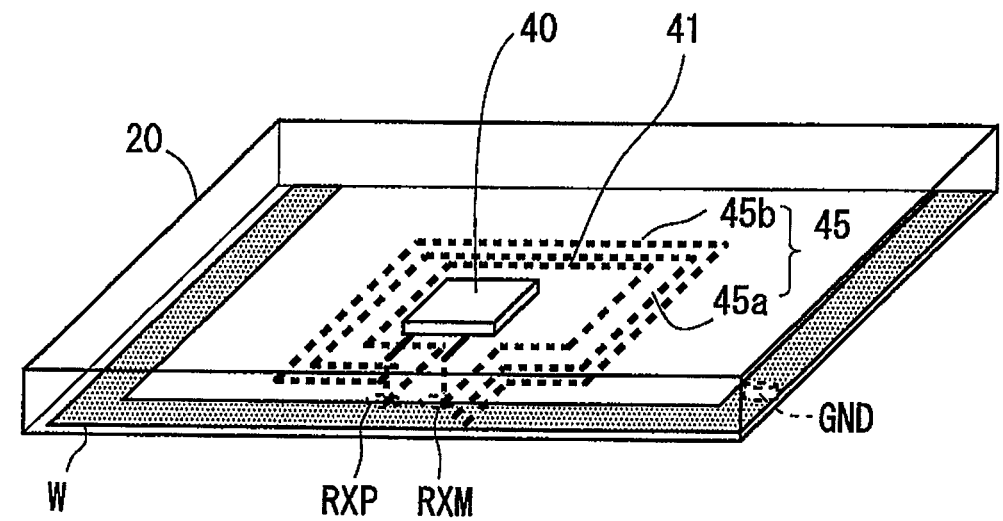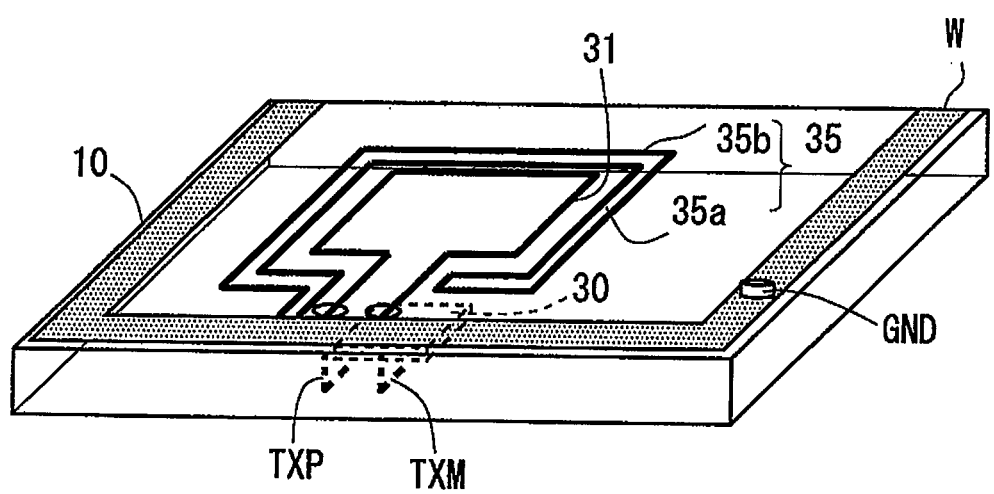
Fig. 3

NON-CONTACT COMMUNICATION APPARATUS AND SYSTEM USING THE SAME

CROSS-REFERENCE TO RELATED APPLICATIONS

This application is based upon and claims the benefit of priority from Japanese patent application No. 2015-068410, filed on Mar. 30, 2015 and Japanese patent application No. 2015-181616, filed on Sep. 15, 2015, the disclosure of which is incorporated herein in its entirety by reference.

BACKGROUND

The present invention relates to an apparatus and a system using the same and to, for example, an apparatus for performing non-contact communication and a system including the apparatus.

Japanese Unexamined Patent Application Publication No. 2014-53813 discloses a radio communication apparatus using non-contact coupling by a pair of coupling elements. Each of the coupling elements constituting the pair of coupling elements is an inductor and the coupling elements are arranged so that their conductive loops face each other. As the two conductive loops are arranged to face each other, a magnetic field generated by a current flowing through one of the coupling elements goes through the conductive loop of the other one of the coupling elements, and a data signal is transmitted.

SUMMARY

In related art, guard rings formed of a metal layer may be provided around inductors and antennas on a board in order to block noise. The guard rings are arranged to surround looped inductors. Also in the wireless communication apparatus disclosed in Japanese Unexamined Patent Application Publication No. 2014-53813, the guard rings can be arranged to surround the coupling elements as a noise countermeasure.

In the above Japanese Unexamined Patent Application Publication No. 2014-53813, the other one of the coupling elements is disposed in the magnetic field generated by the current flowing through the one of the coupling elements, and induced an electromotive force that reflects the data signal is generated in the other one of the coupling elements to thereby transmit the data signal. When the guard rings are provided around the coupling elements disclosed in Japanese Unexamined Patent Application Publication No. 2014-53813 as a noise countermeasure, and currents flow through the guard rings due to the noise, unnecessary magnetic fields are generated, thereby causing a problem in the transmission of data signals.

Other problems of the related art and new features of the present invention will become apparent from the following descriptions of the specification and attached drawings.

In an aspect of the present invention, a guard ring that is disposed to be adjacent to a circumference of an inductor on a board includes a first guard ring part and a second guard ring part, in which one ends of the first guard ring part and the second guard ring part are connected to each other, and other ends of the first guard ring part and the second guard ring part are connected to a first power supply.

According to the above aspect, the guard ring including the first guard ring part and the second guard ring part can reduce an influence of induction magnetic fields generated by currents flowing through the guard ring due to noise on transmission of data signals.

BRIEF DESCRIPTION OF THE DRAWINGS

The above and other aspects, advantages and features will be more apparent from the following description of certain embodiments taken in conjunction with the accompanying drawings, in which:

FIG. 3 is a drawing showing a part of the configuration of the apparatus according to a first embodiment;

DETAILED DESCRIPTION

Figure 1:
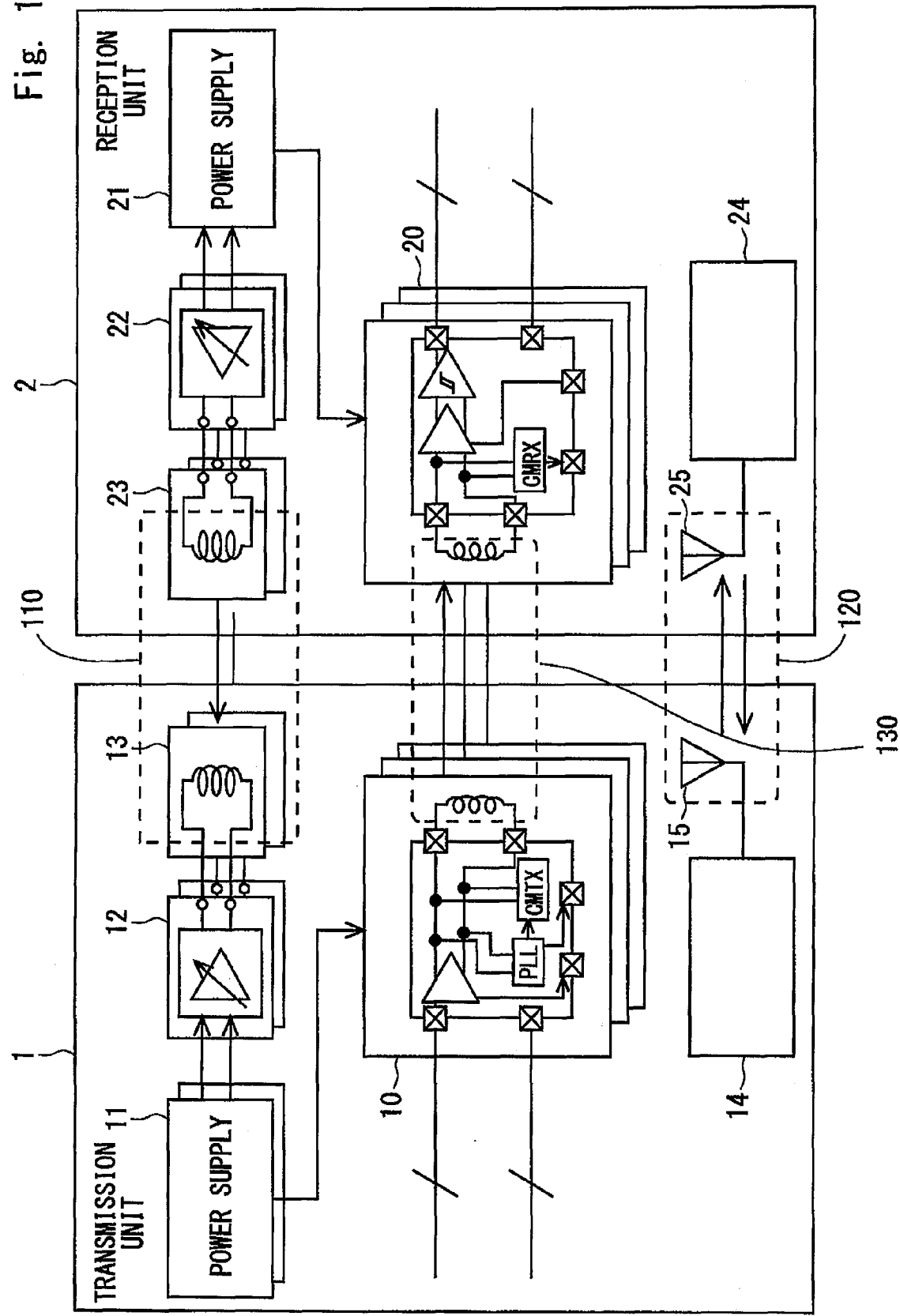
FIG. 1 is a drawing showing an overall configuration of a system according to an embodiment.

Hereinafter, embodiments shall be explained with reference to the drawings. To clarify the explanation, some parts thereof and some of the drawings have been omitted or simplified as appropriate. Further, the elements illustrated in the drawings as functional blocks for performing various processes can be implemented hardware-wise by a CPU, a memory, and other circuits, and software-wise by a program loaded onto a memory or the like. Accordingly, it is to be understood by those skilled in the art that these functional blocks can be implemented in various forms including, but not limited to, being implemented by hardware alone, software alone, or a combination of hardware and software.

Specific values and the like shown in the following embodiments are merely illustrative for easier understanding of the invention, and unless otherwise particularly specified, the embodiments are not limited to them. Note that in the drawings, the same elements are denoted by the same reference numerals, and repeated descriptions are omitted as needed.

The embodiments relate to an apparatus that performs non-contact communication in a near field using non-contact coupling and a system using the apparatus. The non-contact coupling is, for example, inductive coupling or capacitive coupling. The apparatus according to the embodiments includes inductors formed on a board. In the embodiments, guard rings are provided around the inductors as one of noise countermeasures in order to realize stable high-speed communication in such an apparatus.

Firstly, an overall configuration of a system according to the embodiments shall be explained by referring to FIG. 1. FIG. 1 is a drawing showing the overall configuration of a system 100 according to a first embodiment. The system 100 includes a transmission unit 1 and a reception unit 2. The transmission unit 1 includes transmission boards 10, a power supply 11, a power transmitting driver unit 12, a power supply coil 13, an RFID (radio frequency identifier) chip 14, and an antenna 15. The reception unit 2 includes reception boards 20, a power supply 21, a power receiving driver unit 22, a power receiving coil 23, a reader/writer 24, and an antenna 25.

The system 100 shown in FIG. 1 includes a non-contact power supply unit 110 comprised of the power supply coil 13 and the power receiving coil 23, an RFID communication unit 120 comprised of the antenna 15 that is connected to the RFID chip 14 and the antenna 25 that is provided for the reader/writer 24, and a non-contact communication unit 130 comprised of coupling elements in the transmission board 10 and the reception board 20. That is, the system 100 according to the embodiment includes a plurality of non-contact connectors. Hereinafter, an overview of each unit will be explained.

<Non-Contact Power Supply Unit 110>

In the system 100, power can be supplied from the transmission unit 1 to the reception unit 2 contactlessly (wirelessly). The power supply 11, the power transmitting driver unit 12, and the power supply coil 13 of the transmission unit 1 and the power supply 21, the power receiving driver unit 22, and the power receiving coil 23 of the reception unit 2 are used for the non-contact power supply. For example, the electromagnetic induction method using electromagnetic induction between the power supply coil 13 and the power receiving coil 23 that are arranged apart from each other can be used for the method of the non-contact power supply.

In the example shown in FIG. 1, in the transmission unit 1 side, currents supplied by the power supply 11 are amplified by the power transmitting driver unit 12 and supplied to the power supply coil 13. Magnetic flux is generated in the power supply coil 13 by the supplied currents. In the reception unit 2 side, currents flow through the power receiving coil 23 due to the magnetic flux generated in the power supply coil 13. These currents are rectified by the power receiving driver unit 22 and supplied to the power supply 21. In this manner, the power can be transmitted contactlessly to the power supply 21 in the reception unit 2. Note that the method of the non-contact power supply is not particularly limited, and the magnetic resonance method using resonance coupling of electromagnetic fields or the like can be used.

<RFID Communication Unit 120>

In the system 100, RFID communication from the transmission unit 1 to the reception unit 2 is possible using the RFID chip 14 and the reader/writer 24. The RFID chip 14 and the antenna 15 constitute an RFID tag. A capacitor and a memory circuit and the like for storing data such as an identification number that constitute a resonance circuit together with the antenna 15 are formed on the RFID chip 14. The RFID tag exchanges information by short-distance wireless communication that uses electromagnetic waves or radio waves transmitted from the reader/writer 24.

<Non-Contact Communication Unit 130>

The system 100 performs the non-contact communication using the coupling elements of the transmission board 10 and the reception board 20. In the embodiment, an example in which three transmission boards 10 are provided in the transmission unit 1 and three reception boards 20 are provided in the reception unit 2 is shown.

Figure 2:
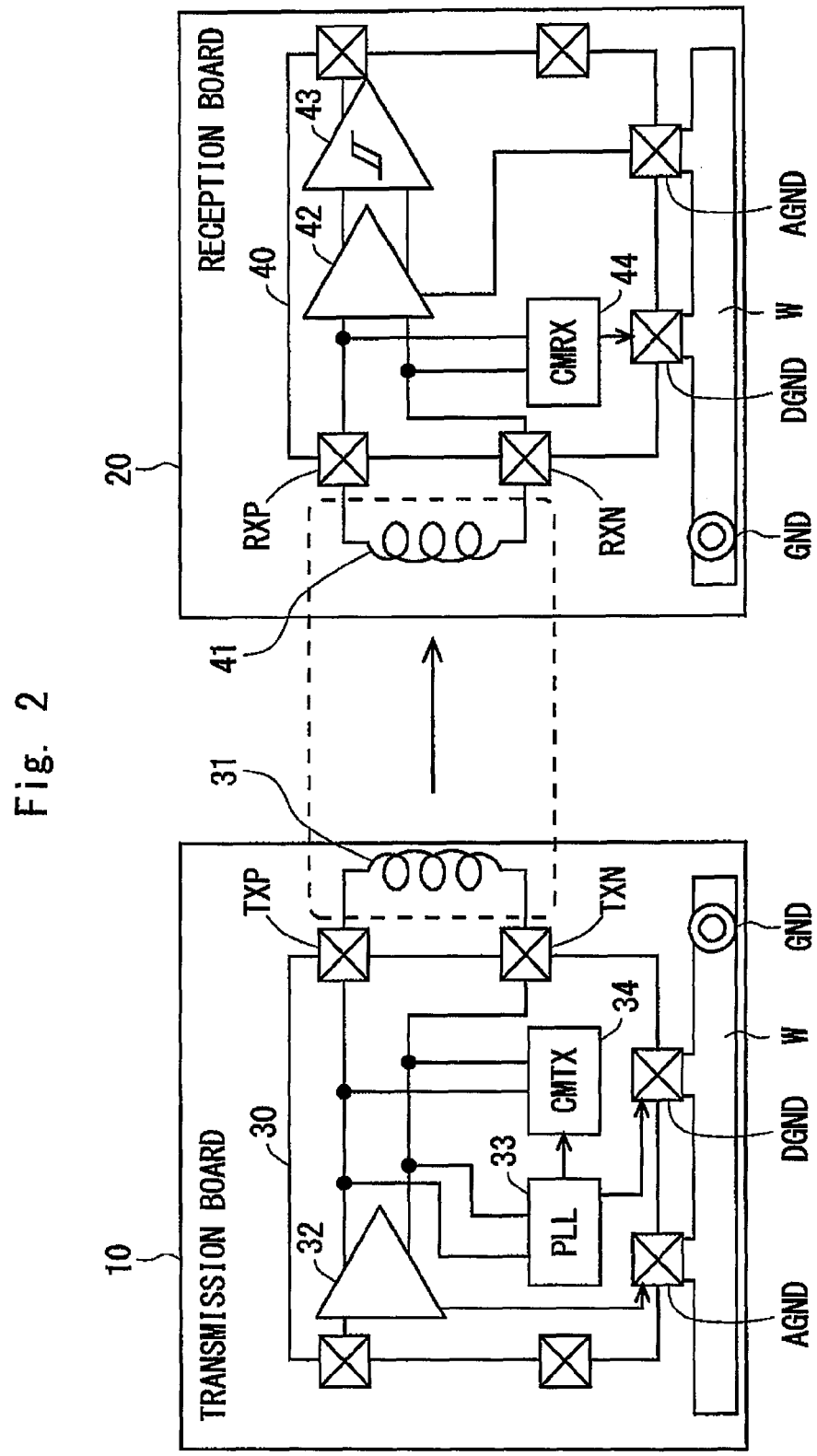
FIG. 2 is a drawing showing a configuration of an apparatus according to the embodiment.

FIG. 2 is a drawing showing a configuration of the transmission board 10 and the reception board 20 which are apparatuses according to the embodiment. As shown in FIG. 2, the transmission board 10 includes a transmission chip 30 and a transmission inductor 31. The ends of the transmission inductor 31 are connected to output ports TXP and TXN of the transmission chip 30, respectively. A differential driver 32, a PLL (Phase Locked Loop) 33, and a CMTX (Common Mode Transmitter) 34 are provided on the transmission chip 30.

A pair of signal lines from the differential driver 32 is connected to the output ports TXP and TXN. The PLL 33 and the CMTX 34 are connected to the pair of signal lines. A ground terminal GND, a ground wire W, an analog ground AGND, and a digital ground DGND are provided on the transmission board 10. The analog ground AGND and the digital ground DGND are connected to the ground terminal GND through the ground wire W. The differential driver 32 is connected to the analog ground AGND and the PLL 33 is connected to the digital ground DGND.

The reception board 20 includes a reception chip 40 and a reception inductor 41. The ends of the reception inductor 41 are connected to input ports RXP and RXN of the reception chip 40, respectively. A differential amplifier 42, a hysteresis comparator 43, and a CMRX (Common Mode Receiver) 44 are provided on the reception chip 40.

A pair of signal lines from the input ports RXP and RXN is connected to an input side of the differential amplifier 42. The CMRX 44 is connected to the pair of signal lines from the input ports RXP and RXN. An output from the differential amplifier 42 is input to the hysteresis comparator 43. A ground terminal GND, a ground wire W, an analog ground AGND, and a digital ground DGND are provided on the reception board 20. The analog ground AGND and the digital ground DGND are connected to the ground terminal GND through the ground wire W. The differential amplifier 42 is connected to the analog ground AGND and the PLL 33 is connected to the digital ground DGND.

The transmission board 10 according to the embodiment can wirelessly transmit a differential mode signal and a common mode signal at the same time to the reception board 20 through non-contact coupling formed between a pair of the transmission inductor 31 and the reception inductor 41. In the above example, the transmission board 10 transmits the differential mode signal and the common mode signal, and the reception board 20 receives the differential mode signal and the common mode signal.

The differential driver 32 receives a transmission data signal (a baseband signal), generates a differential baseband signal, and drives the transmission inductor 31 through the pair of signal lines. Note that in this embodiment, as simultaneous transmission of the differential mode signal and the common mode signal is assumed, it is desirable to reduce common mode noise caused by the differential driver 32. Accordingly, a last stage of the differential driver 32 can be, for example, a cascade amplifier.

The PLL 33 adjusts an oscillating frequency and a phase of a VCO (Voltage Controlled Oscillator) according to an edge timing of the transmission data signal and generates a sine wave clock signal that tracks the frequency and the phase of the transmission data signal. The CMTX 34 drives the two signal lines of the pair of signal lines by the sine wave clock signal generated by the PLL 33. That is, the CMTX 344 uses the sine wave clock signal as the common mode signal.

The differential amplifier 42 receives the differential mode signal that has been received by the reception inductor 41 and the common mode signal that has been superimposed on the pair of signal lines by the CMTX 34, amplifies the differential mode signal, and also removes the common mode signal. The hysteresis comparator 43 receives the differential baseband signal (i.e., a differential pulse signal) and outputs a result of comparing two signal voltages of the differential pulse signal. An output from the hysteresis comparator 43 indicates a restored data signal. The CMRX 44 receives the common mode signal through the reception inductor 41 and restores a clock signal.

The transmission inductor 31 and the reception inductor 41 are comprised of conductive loops that are formed on the transmission board 10 and the reception board 20, respectively. The transmission inductor 31 and the reception inductor 41 are arranged so that their conductive loops face each other. As the two conductive loops are arranged to face each other, electric fields H (magnetic flux) generated by currents flowing through the transmission inductor 31 efficiently go through the conductive loop of the reception inductor 41, and thus the differential mode signal can be transmitted highly accurately. Further, as the two conductive loops constituting the transmission inductor 31 and the reception inductor 41 are arranged to face each other, capacitive coupling coefficients of the coupling elements 23 and 33 can be increased, and thus the common mode signal can be accurately transmitted.

Note that the above configuration of the transmission board 10 and the reception board 20 for performing the non-contact communication is merely an example, and another configuration can be employed. A direction of transmitting the differential mode signal and the common mode signal may be one direction or bidirectional. The system 100 may include a plurality of pairs of the differential driver 32 and the differential amplifier 42 for differential mode transmission and the hysteresis comparator 43 and may include a plurality of pairs of the CMTX 34 and the CMRX 44 for common mode transmission. Further, the system according to the embodiment may include a plurality of non-contact connectors as shown in FIG. 1 or may be a system that includes a single non-contact connector and performs only non-contact communication as shown in FIG. 2.

In the system according to the embodiment, five pairs of antennas, namely, three pairs of antennas of the three transmission boards 10 and reception boards 20, a pair of antennas of the non-contact power supply unit 110, and a pair of antennas of the RFID communication unit 120 are provided. In general, there are two possible causes of noise received by the inductors formed on the boards. These causes shall be explained below.

(1) Digital signals transmitted through the wires formed on the boards electrically shake a ground potential on the same boards (for example, the ground potential becomes unstable due to the clock signals and digital control signals of the PLL 33 of the transmission board 10).

(2) Radio equipment (a mobile phone, a radio antenna etc.) provided around the board is coupled to the inductor (for example, the transmission inductor 31 or the reception inductor 41 is coupled to the power supply coil 13 or the power receiving coil 23 of the non-contact power supply unit 110 or the antenna 15 or 25 of the RFID communication unit 120 or the like).

As has been explained above, in the embodiment, the analog ground AGND in an analog block such as an amplifier is configured separately from the digital ground DGND in a digital block such as the PLL 33. The analog ground AGND and the digital ground DGND can be physically separated. However, in order to reduce the cost, a board including metal layers, one layer on the front surface of the board and one layer on the rear face of the board (hereinafter referred to as a single-layer board), may be used. When only two layers of the metal layers can be used in this way, the analog ground AGND and the digital ground DGND will be formed of the same metal layer, and noise of the digital ground DGND may come into the analog ground AGND.

In the embodiment, guard rings are provided around the transmission inductor 31 and the reception inductor 41 to reduce such above noise. Hereinafter, a configuration of the guard rings shall be explained with reference to the drawings.

First Embodiment

Figure 4A:
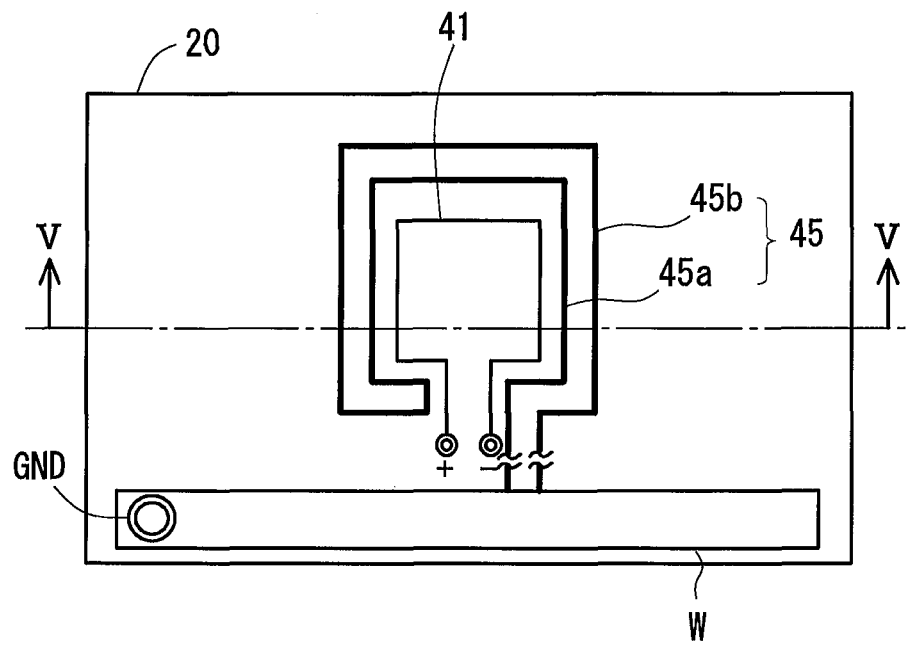
FIGS. 4A and 4B are drawings showing the apparatus shown in FIG. 3 as viewed from the top.
Figure 4B:
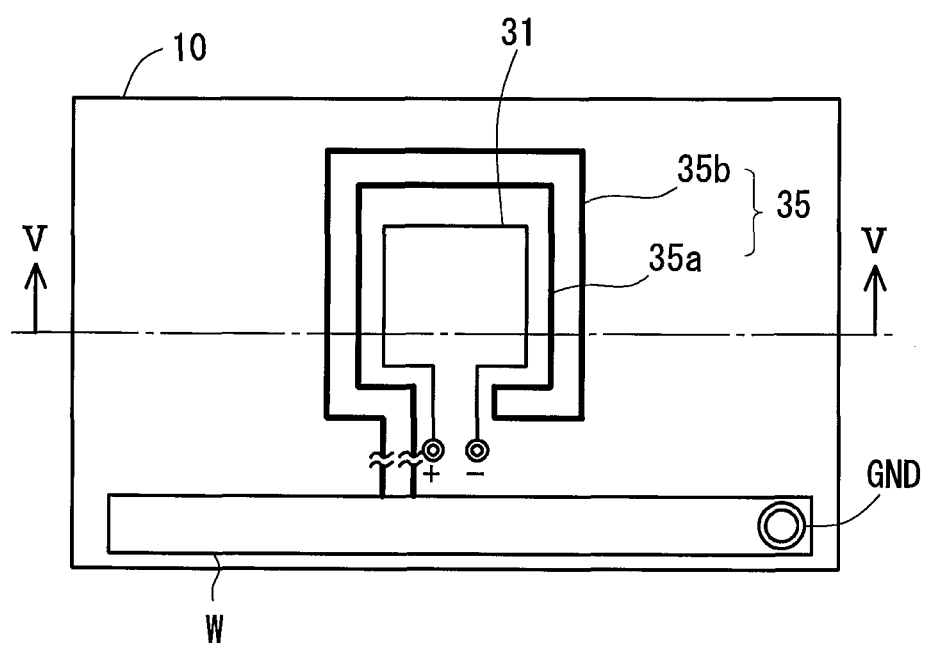
Figure 5:
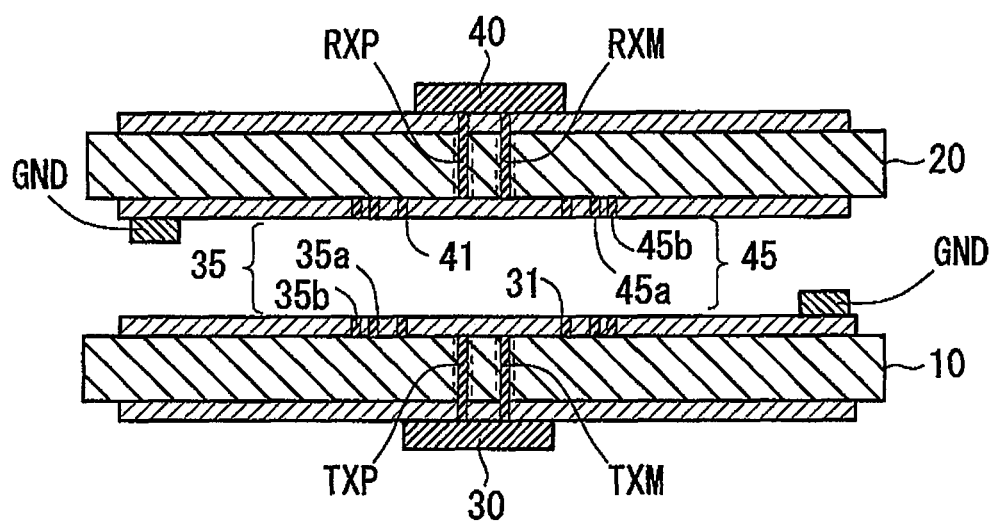
FIG. 5 is a cross-sectional diagram taken along the line V-V of FIGS. 4A and 4B.

A configuration of an apparatus according to a first embodiment will be explained with reference to FIGS. 3 to 5. FIG. 3 is a drawing showing a part of a configuration of the transmission board 10 and the reception board 20 that are the apparatuses according to the first embodiment. FIG. 3 shows a state in which the transmission inductor 31 and the reception inductor 41 that are formed on the transmission board 10 and the reception board 20, respectively, are arranged to face each other. FIG. 4A is a drawing showing the reception board 20 shown in FIG. 3 as viewed from the top. FIG. 4B is a drawing showing the transmission board 10 shown in FIG. 3 as viewed from the top. FIG. 5 is a cross-sectional diagram taken along the line V-V of FIGS. 4A and 4B. In FIG. 5, the transmission inductor 31 and the reception inductor 41 are arranged to face each other.

The transmission inductor 31, a double guard ring 35, the ground terminal GND, and the ground wire W are provided on a first surface of the transmission board 10. The transmission inductor 31, the double guard ring 35, and the ground wire W are formed of a first metal layer that is formed on the first surface of the transmission board 10. A ground voltage is supplied to the ground terminal GND from a first power supply on the transmission board 10 side. The transmission chip 30 is disposed on a second surface that is a rear surface of the first surface of the transmission board 10.

The ports TXP and TXM of the transmission chip 30 are connected to a wire formed of a second metal layer that is formed on the second surface of the transmission board 10. That is, the transmission board 10 is a single-layer board in which one layer of a metal layer is formed on the front surface of the transmission board 10 and one layer is formed on the rear surface thereof. The transmission inductor 31 is connected to the transmission chip 30 through vias formed on the transmission board 10 and the wire formed of the second metal layer.

The double guard ring 35 is provided around the transmission inductor 31. The double guard ring 35 surrounds the transmission inductor 31 in a planar view. The double guard ring 35 includes a first guard ring part 35a and a second guard ring part 35b. The first guard ring part 35a is disposed to be adjacent to the transmission inductor 31. The first guard ring part 35a surrounds the transmission inductor 31. The second guard ring part 35b is disposed to be adjacent to an outer side of the first guard ring part 35a. The second guard ring part 35b surrounds the first guard ring part 35a.

One end of the first guard ring part 35a is connected to one end of the second guard ring part 35b. The other end of the first guard ring part 35a and the other end of the second guard ring part 35b are connected to the ground terminal GND through the ground wire W. A connection point of the first guard ring part 35a and the ground wire W is disposed near one terminal of the transmission inductor 31. The first guard ring part 35a is extended from the connection point of the first guard ring part 35a and the ground wire W to near the other terminal of the transmission inductor 31 to surround the transmission inductor 31.

The second guard ring part 35b is extended from the other end of the first guard ring part 35a disposed near the other terminal of the transmission inductor 31 to surround the first guard ring part 35a. A connection point of the second guard ring part 35b and the ground wire W is disposed near one terminal of the transmission inductor 31. When currents flow in a first direction of the first guard ring part 35a due to noise, currents flow in a second direction, which is a direction opposite to the first direction, through the second guard ring part 35b.

The reception board 20 has a configuration that is substantially the same as that of the transmission board 10. More specifically, the reception inductor 41, a double guard ring 45, the ground terminal GND, and the ground wire W are provided on a first surface of the reception board 20. The reception inductor 41, the double guard ring 45, the ground terminal GND, and the ground wire W are formed of a first metal layer that is formed on the first surface of the reception board 20. A ground voltage is supplied to the ground terminal GND from a first power supply on the reception board 20 side. The reception chip 40 is disposed on a second surface that is a rear surface of the first surface of the reception board 20.

The ports RXP and RXM of the reception chip 40 are connected to a wire formed of a second metal layer that is formed on the second surface of the reception board 20. That is, the transmission board 20 is a single-layer board in which one layer of a metal layer is formed on each of the front and rear surfaces of the reception board 20. The transmission inductor 41 is connected to the reception chip 40 through vias formed on the reception board 20 and the wire formed of the second metal layer.

The double guard ring 45 is provided around the reception inductor 41. The double guard ring 45 surrounds the reception inductor 41 in a planar view. The double guard ring 45 includes a first guard ring part 45a and a second guard ring part 45b. The first guard ring part 45a is disposed to be adjacent to the reception inductor 41. The first guard ring part 45a surrounds the reception inductor 41. The second guard ring part 45b is disposed to be adjacent to an outer side of the first guard ring part 45a. The second guard ring part 45b surrounds the first guard ring part 45a.

One end of the first guard ring part 45a is connected to one end of the second guard ring part 45b. The other end of the first guard ring part 45a and the other end of the second guard ring part 45b are connected to the ground terminal GND through the ground wire W. A connection point of the first guard ring part 45a and the ground wire W is disposed near one terminal of the reception inductor 41. The first guard ring part 45a is extended from the connection point between the first guard ring part 45a and the ground wire W to near the other terminal of the reception inductor 41 to surround the reception inductor 41.

The second guard ring part 45b is extended from the other end of the first guard ring part 45a disposed near the other terminal of the reception inductor 41 to surround the first guard ring part 45a. A connection point between the second guard ring part 45b and the ground wire W is disposed near one terminal of the reception inductor 41. When currents flow in a first direction of the first guard ring part 45a due to noise, currents flow in a second direction, which is a direction opposite to the first direction, through the second guard ring part 45b.

Figure 6:
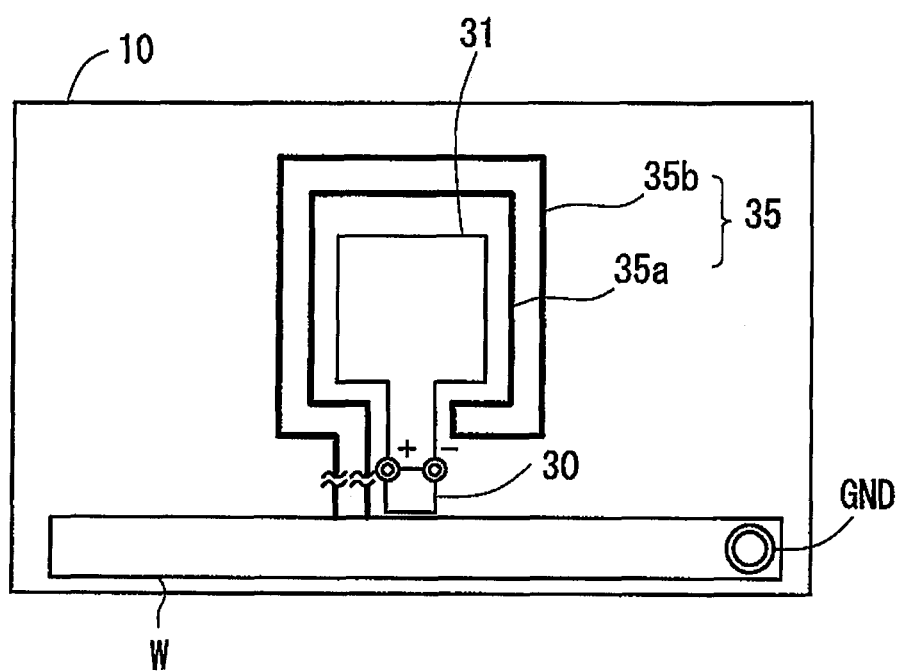
FIG. 6 is a drawing showing a part of another configuration of the apparatus according to the first embodiment.

Note that in the examples shown in FIGS. 3 to 5, although the transmission chip 30 and the reception chip 40 are provided on the rear surfaces of the transmission board 10 and the reception board 20, respectively, it is not limited to this. FIG. 6 shows an example of a layout of a single-layer board in which a metal layer is formed only on the front surface of the transmission board 10. As shown in FIG. 6, the transmission chip 30 may be disposed on the same surface as the surface on which the transmission inductor 31 of the transmission board 10 is provided. The transmission chip 30 and the transmission inductor 31 are connected by the metal layer on the front surface of the transmission board 10. Likewise, as for the reception board 20, the reception chip 40 can be disposed on the same surface on which the reception inductor 41 is provided.

Figure 16:
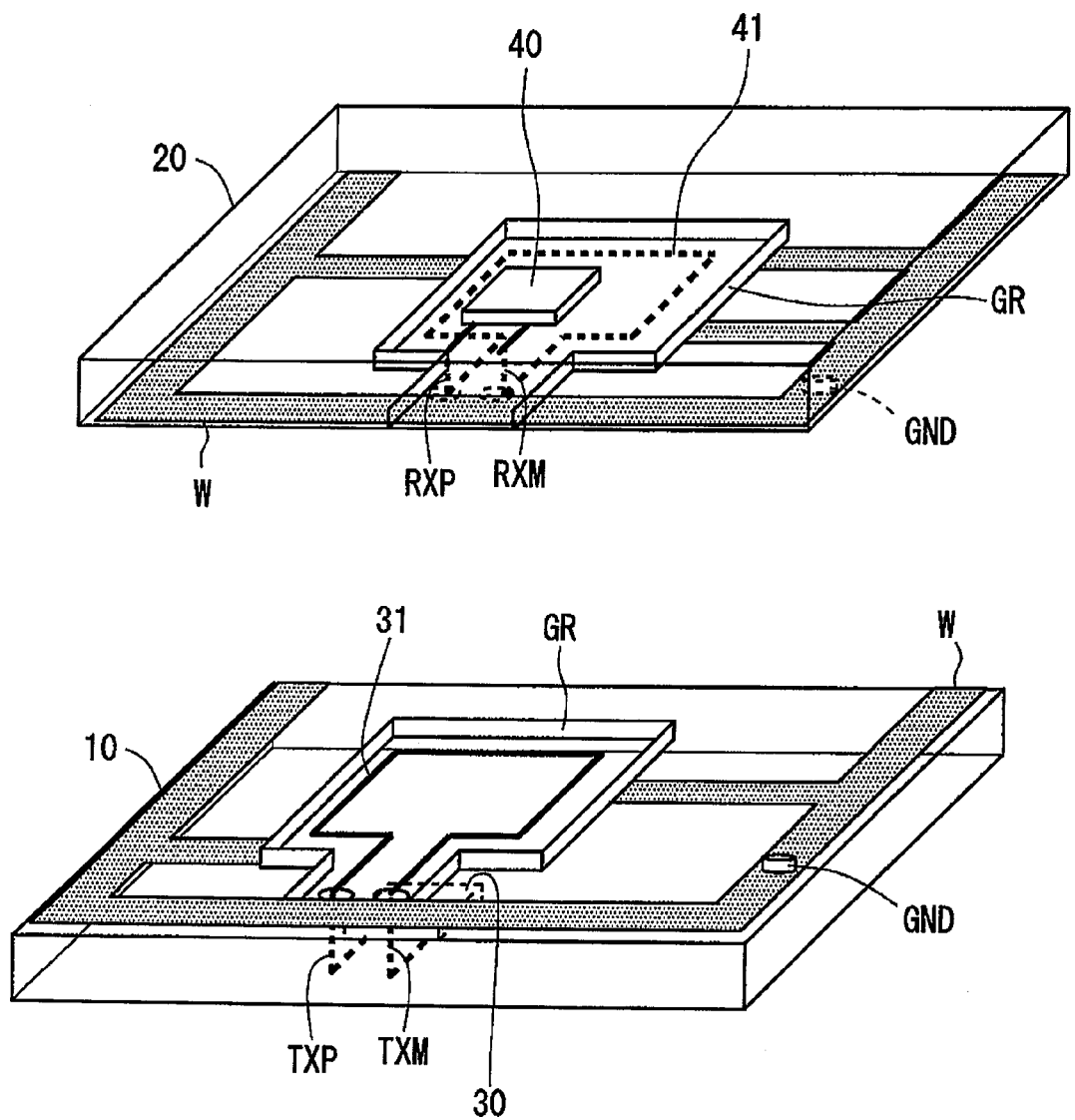
FIG. 16 is a drawing showing a part of a configuration of an apparatus according to a comparative example.
Figure 17A:
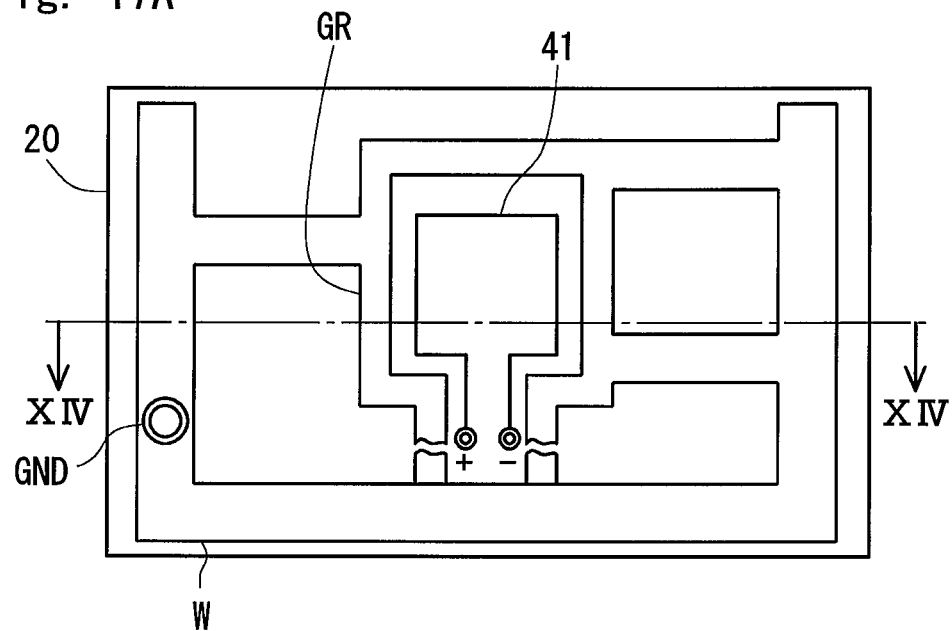
FIGS. 17A and 17B show the apparatus shown in FIG. 16 as viewed from the top.
Figure 17B:
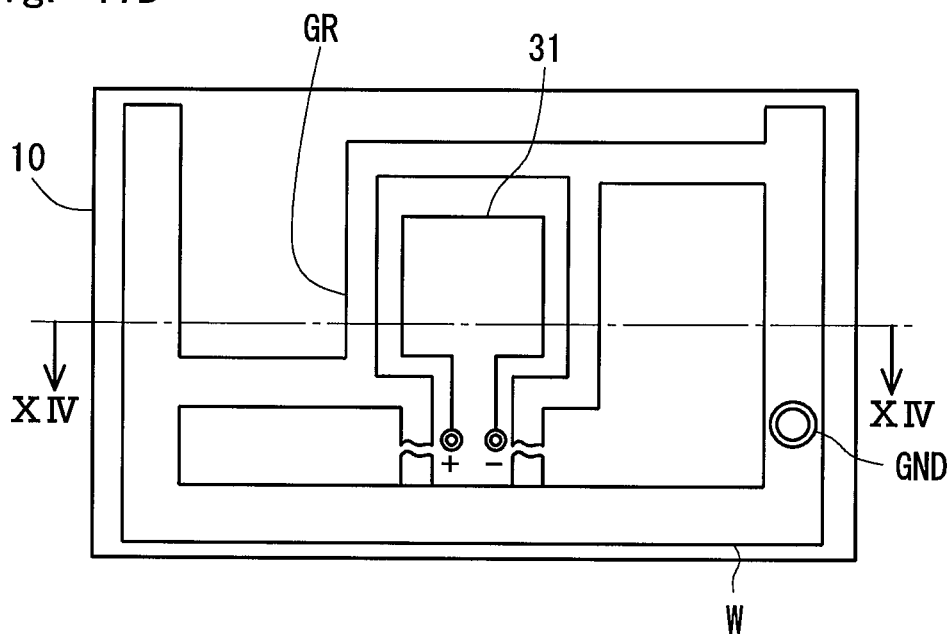
Figure 18:
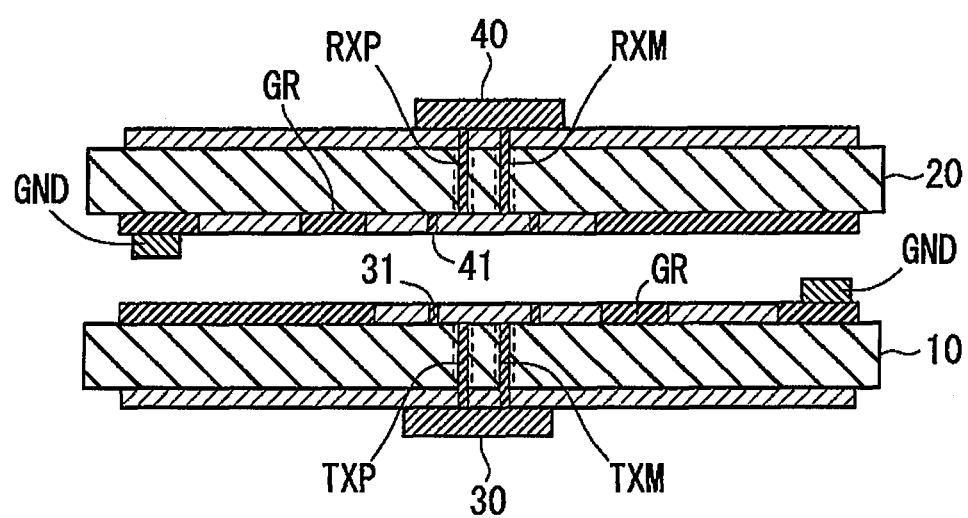
FIG. 18 is a cross-sectional diagram taken along the line XIV-XIV of FIGS. 17A and 17B.
Figure 19:
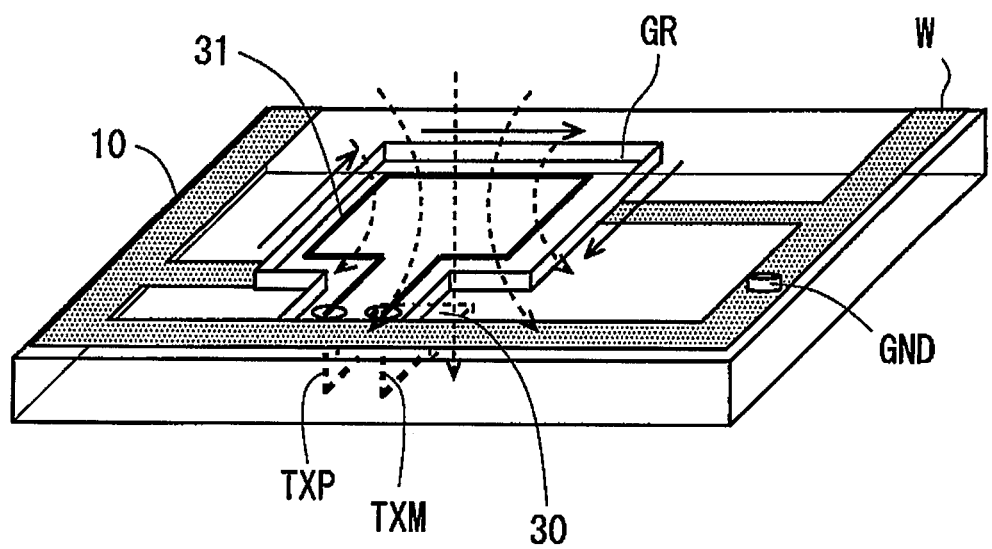
FIG. 19 is a drawing for explaining an operation of the apparatus according to the comparative example.

As a comparison, an example of a case where a single guard ring is provided instead of the above double guard rings 35 and 45 will be explained. FIG. 16 is a drawing showing a part of a configuration of an apparatus according to a comparative example. FIG. 17A is a drawing showing the reception board 20 shown in FIG. 16 as viewed from the top. FIG. 17B is a drawing showing the transmission board 10 shown in FIG. 16 as viewed from the top. FIG. 18 is a cross-sectional diagram taken along the line XIV-XIV of FIGS. 17A and 17B. FIG. 19 is a drawing for explaining an operation of the apparatus according to the comparative example. FIGS. 16 and 18 show a state in which the transmission inductor 31 and the reception inductor 41 are arranged to face each other.

As shown in FIGS. 16 and 17, in the comparative example, single ringed guard rings GR are provided around the transmission inductor 31 and the reception inductor 41, respectively. The guard rings GR have a shape similar to those of the transmission inductor 31 and the reception inductor 41 and surround the transmission inductor 31 and the reception inductor 41, respectively. In the example shown in FIG. 16, a plurality of points of the guard rings GR are connected to the ground wire W to maintain an equal voltage. That is, a plurality of ground input points are formed in the guard rings GR.

Although a configuration of the comparative example is effective against the noise caused by the coupling between the inductor and another piece of radio equipment around the board, which has been explained in (2), it is less effective to the noise that is caused by the digital signals transmitted on the board electrically shaking the ground potential on the same board, which has been explained in (1). In particular, a layout pattern in which the analog ground AGND and the digital ground DGND are disposed to be comparatively close to each other, and when it is difficult to form the plurality of ground input points due to a limited area and layout, it is less effective.

An operation of the apparatus according to the comparative example will be explained by referring to FIG. 19. FIG. 19 illustrates only the transmission board 10. At the time of transmitting the digital signals, large currents instantaneously flow through the transmission inductor 31. As the actual ground potential has a limited resistance, the ground potential fluctuates by these currents. When large currents flow through the guard ring GR due to an influence of the fluctuation in the ground potential as indicated by the solid line arrows in FIG. 19, interfering magnetic fields are generated in the transmission inductor 31 inside the guard ring GR as indicated by the dotted line arrows. As a result, an interfering wave is superimposed on the data signals transmitted by the transmission inductor 31, and an error may occur.

Figure 7:
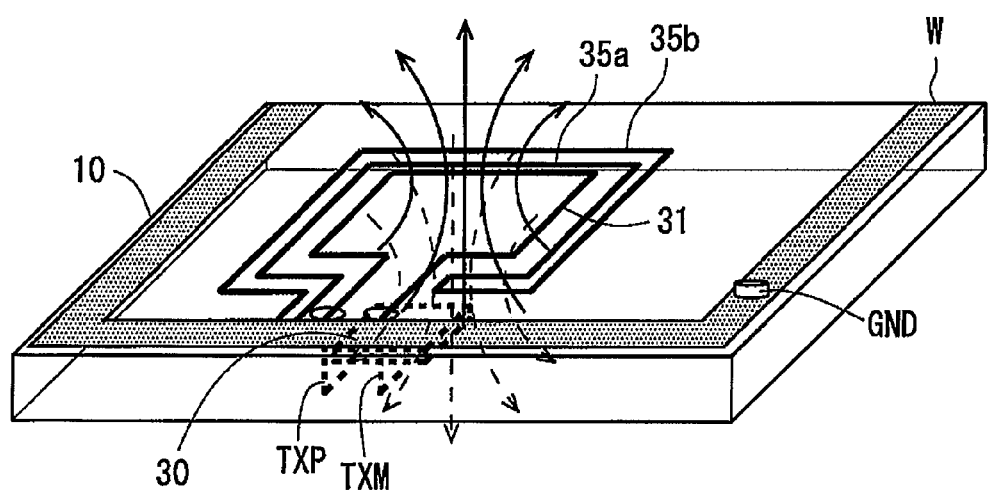
FIG. 7 is a drawing for explaining an operation of the apparatus according to the first embodiment.

On the other hand, FIG. 7 shows an operation of the apparatus according to the first embodiment. In the first embodiment, the double guard ring 35 is provided, in which one ends of the double guard ring 35 are connected to each other, and the other ends of the double guard ring 35 are connected to the ground wire W. When noise that fluctuates the ground potential is generated, currents flow through the first guard ring part 35a, which is an inner circumference guard ring part, and the second guard ring part 35b, which is an outer circumference guard ring part, in directions opposite to each other. For example, when currents flow through the first guard ring part 35a clockwise, induction magnetic fields will become like the ones indicated by the dotted lines in FIG. 7. At this time, currents flow through the second guard ring part 35b counterclockwise, and the induction magnetic fields will become like the ones indicated by the solid lines in FIG. 7.

As the induction magnetic fields that are in the directions opposite to each other are formed by the currents flowing through the first guard ring part 35a and the currents flowing through the second guard ring part 35b, the induction magnetic fields inside the double guard ring 35 will be cancelled. As described above, even when the currents flow through the double guard ring 35 due to the noise that fluctuates the ground potential, the transmission inductor 31 disposed inside the double guard ring 35 will not be influenced by the noise.

When the double guard ring of the first embodiment and the guard ring of the comparative example were designed to have the same size, and ground noise currents at the same level were generated, interference wave levels generated in the inductors inside the guard rings have been simulated. A result of comparing the interference wave levels shall be explained as follows. In this simulation, a model in which a board is an FR4 board (printed circuit board) having a thickness of 16 mm, and one layer of a metal layer is formed on a front surface of the board and one layer of the metal layer is formed on a rear surface of the board, that are two layers of the metal layers, has been built. An inductor having a size of 5 mm was formed on the board, and a guard ring having a width of 3 mm was provided around the inductor. Parameters have been extracted from such a model using an electromagnetic field analysis tool.

The extracted parameters were introduced into a program for circuit designing, ground noise currents from a terminal of the guard rings were made to flow into the model, and a frequency characteristic of interference waves applied on the inductors has been checked. When the ground noise is generated in the transmission board 10, the interference wave levels generated in the transmission inductor 31 and the reception inductor 41 have improved in the first embodiment by −10 dB to −20 dB, respectively, as compared to the comparative example.

In this way, the double guard ring 35 according to the embodiment can cancel the influence of the induction magnetic fields that are generated by the ground noise caused by the transmission of the digital signals on the same board. This reduces the influence of the double guard ring on the inductor inside the double guard ring, and thus stable and high-speed communication can be realized. When the layout and the area are limited, and the plurality of ground input points cannot be formed, or when a solid ground other than the two layers of the metal layer formed on both surfaces of the board cannot be provided, it is possible to effectively block the noise.

Second Embodiment

Figure 8A:
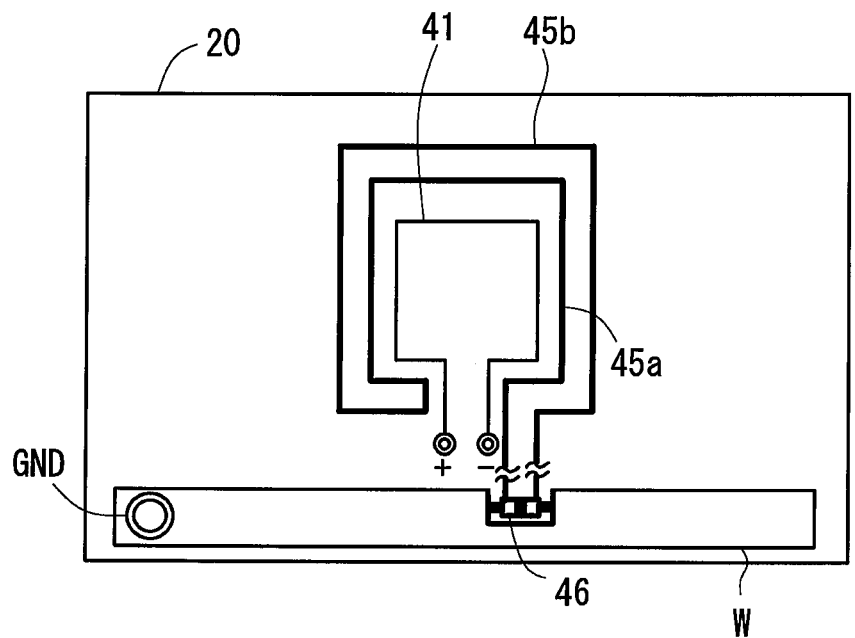
FIGS. 8A and 8B are drawings showing a part of a configuration of an apparatus according to a second embodiment.
Figure 8B:
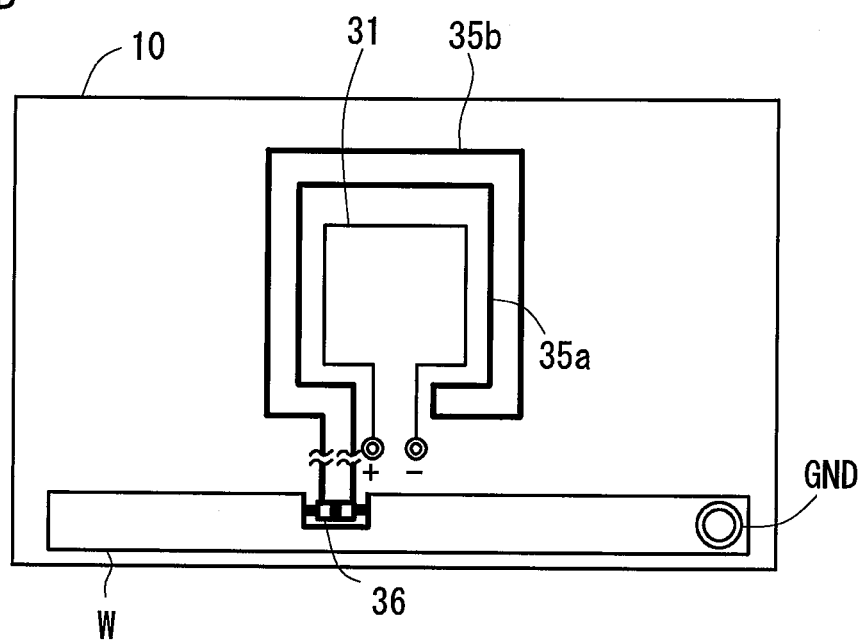

An apparatus according to a second embodiment will be explained by referring to FIGS. 8A and 8B. FIGS. 8A and 8B are drawings showing a part of a configuration of the apparatus according to the second embodiment. FIG. 8A shows the reception board 20 as viewed from the top. FIG. 8B shows the transmission board 10 as viewed from the top. In the second embodiment, a capacitor 36 is added between the first guard ring part 35a and the second guard ring part 35b of the first embodiment, and a capacitor 46 is added between the first guard ring part 45a and the second guard ring part 45b of the first embodiment.

The capacitor 36 is connected between the connection point of the first guard ring part 35a and the ground wire W and the connection point between the second guard ring part 35b and the ground wire W. A single guard ring 47 is connected between the connection point of the first guard ring part 45a and the ground wire W and the connection point between the second guard ring part 45b and the ground wire W. As the capacitors 36 and 46 are added, the frequency characteristic can be improved using resonance, and thus impedances of the double guard rings 35 and 45 can be reduced. By adjusting capacitances of the capacitors which will be added, a resonance frequency of the double guard ring can be adjusted.

Under a simulation condition that has been explained in the first embodiment, frequency dependency of the ground noise when the ground noise is generated in both the transmission board 10 and the reception board 20 has been examined. In a result of simulation of the second embodiment, a noise level in a 200 MHz band has been reduced by about 10 dB as compared to the first embodiment. Accordingly, by adjusting the capacitances of the capacitors which will be added so that the noise level will become low, it is possible to improve a performance of cancelling the ground noise.

Third Embodiment

Figure 9A:
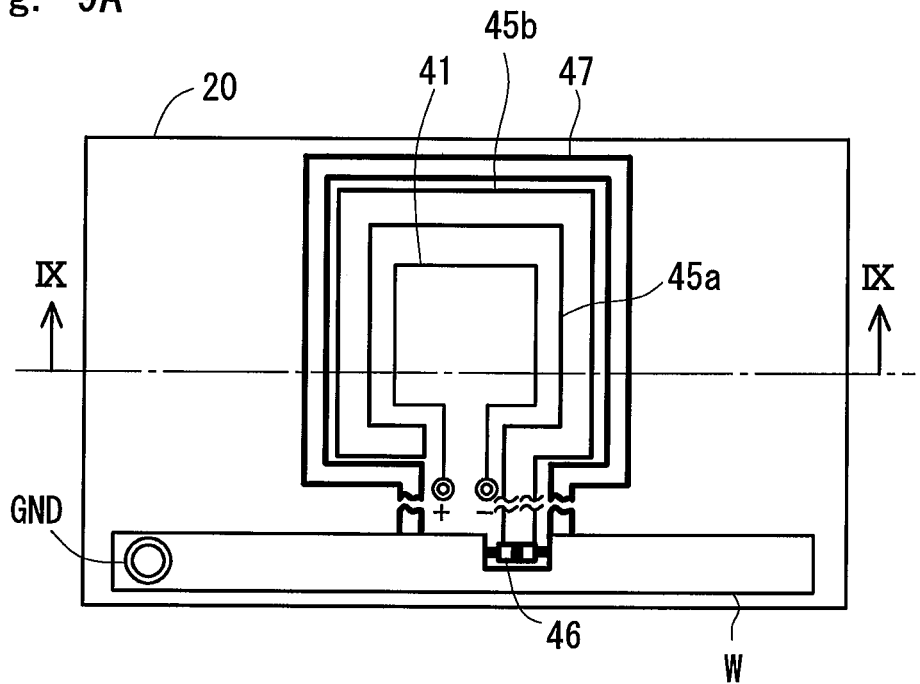
FIGS. 9A and 9B are drawings showing a part of a configuration of an apparatus according to a third embodiment.
Figure 9B:
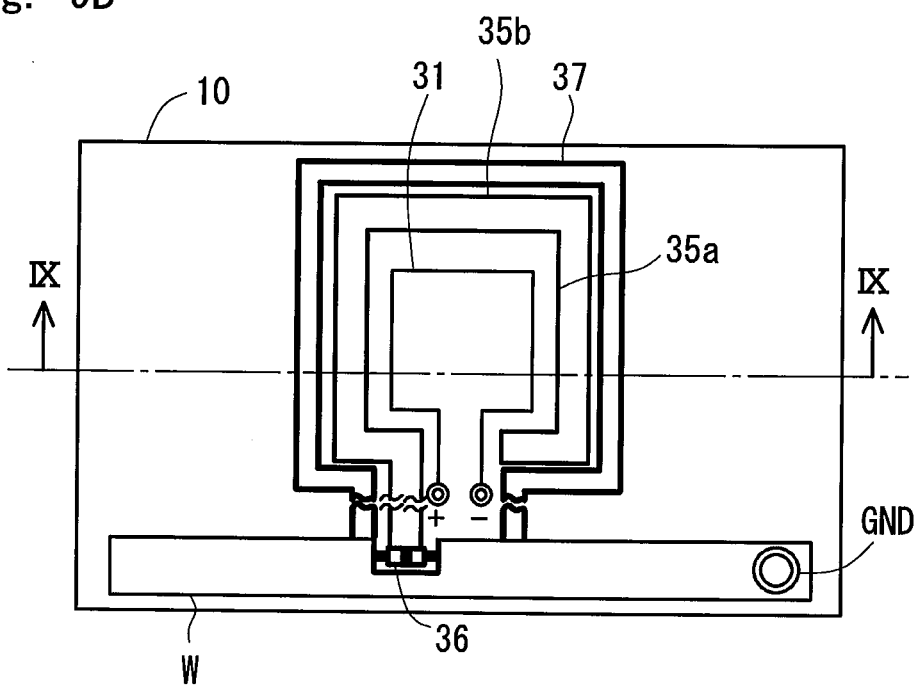
Figure 10:
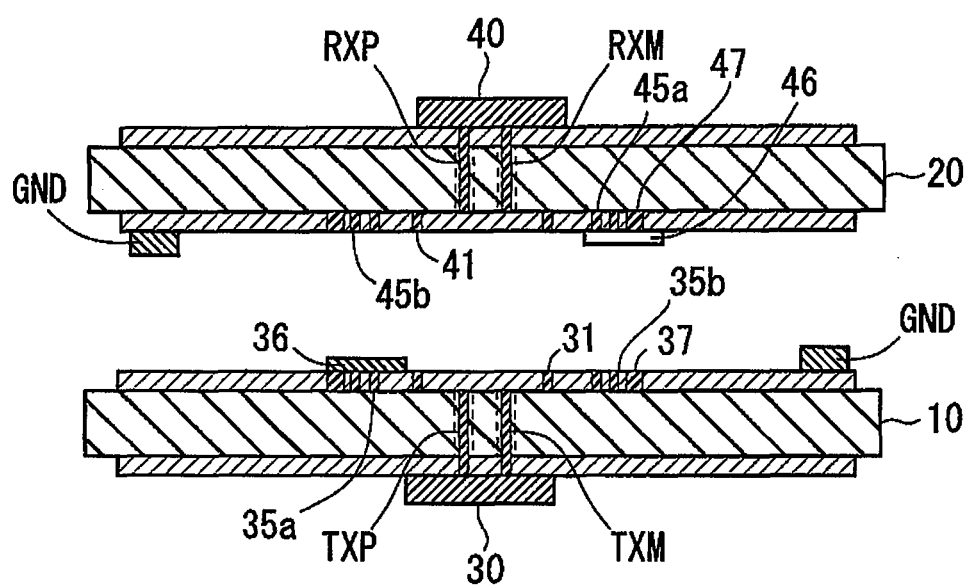
FIG. 10 is a cross-sectional diagram taken along the line IX-IX of FIGS. 9A and 9B.

An apparatus according to a third embodiment shall be explained with reference to FIGS. 9 and 10. FIGS. 9A and 9B are drawings showing a part of a configuration of an apparatus according to the third embodiment. FIG. 9A shows the reception board 20 as viewed from the top. FIG.

9B shows the transmission board 10 as viewed from the top. FIG. 10 is a cross-sectional diagram taken along the line IX-IX of FIGS. 9A and 9B.

In the third embodiment, in a manner similar to the second embodiment, the capacitor 36 is added between the first guard ring part 35a and the second guard ring part 35b of the first embodiment, and the capacitor 46 is added between the first guard ring part 45a and the second guard ring part 45b of the first embodiment.

Further, a single guard ring 37 is provided outside the double guard ring 35. The single guard ring 37 surrounds the double guard ring 35 in planar view. As with the double guard ring 35, the single guard ring 37 is formed of a metal layer. The single guard ring 47 is provided outside the double guard ring 45. The single guard ring 47 surrounds the double guard ring 45 in planar view. As with the double guard ring 45, the single guard ring 47 is formed of a metal layer.

By combining the double guard rings and the single guard rings in this way, both of the noise that fluctuates the ground potential explained above in (1) and the coupling noise of the inductor explained above in (2) can be reduced. Further, as the capacitors 36 and 46 are provided as in the second embodiment, the frequency characteristic of the double guard ring can be adjusted.

In the models of the configuration according to the third embodiment and the configuration according to the comparative example, when the ground noise currents are generated in each of the guard rings, and interference is generated in the antenna of another piece of radio equipment, interference wave levels generated in the inductors inside the guard rings have been simulated and compared. According to a result of the simulation, the ground noise levels were reduced in all frequency regions, and the influence of the noise was reduced in the third embodiment as compared to the comparative example.

Fourth Embodiment

Figure 11:
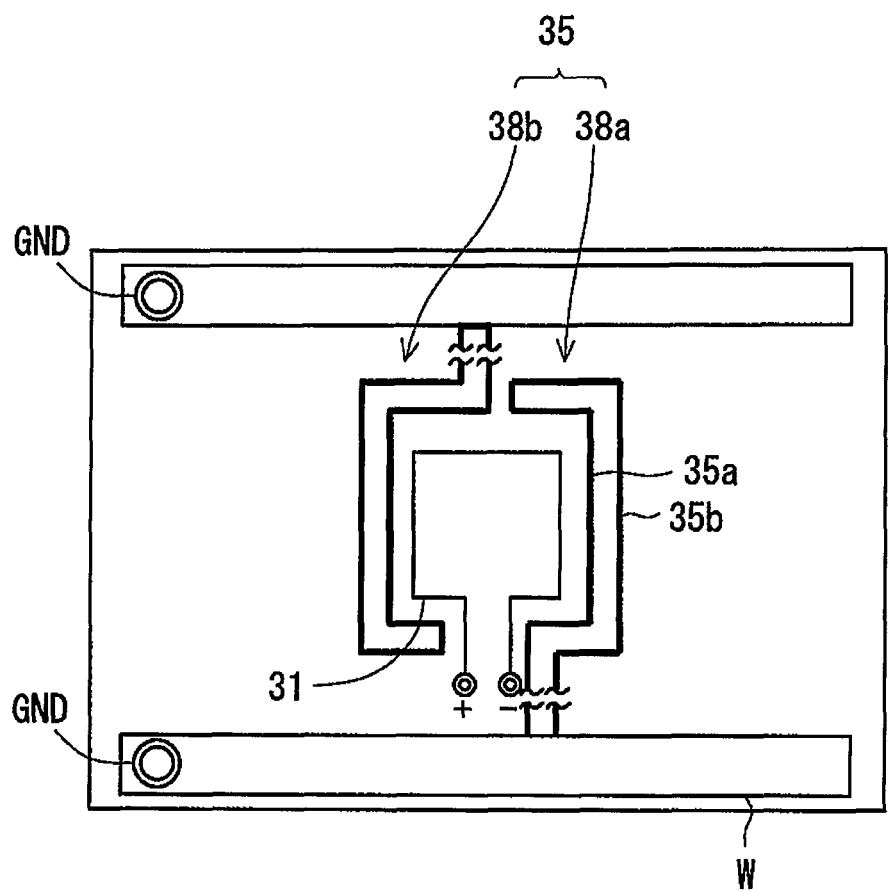
FIG. 11 is a drawing showing a part of a configuration of an apparatus according to a fourth embodiment.

An apparatus according to a fourth embodiment will be explained by referring to FIG. 11. FIG. 11 is a drawing showing a part of a configuration of the apparatus according to the fourth embodiment. FIG. 11 is a drawing showing only the transmission board 10 as viewed from the top.

In the fourth embodiment, the double guard ring 35 includes a first guard ring structure 38a and a second guard ring structure 38b. That is, the double guard ring 35 according to the fourth embodiment is divided into two parts. The transmission inductor 31 is surrounded by the first guard ring structure 38a and the second guard ring structure 38b.

Each of the first guard ring structure 38a and the second guard ring structure 38b includes the first guard ring 35a and the second guard ring part 35b. In the example shown in FIG. 11, ground wires W that are extended in the horizontal direction are provided in upper and lower parts of the transmission board 10. The first guard ring structure 38a is connected to the lower ground wire W.

In the first guard ring structure 38a, one ends of the first guard ring part 35a and the second guard ring part 35b are connected to each other, and the one ends of the first guard ring part 35a and the second guard ring part 35b are connected to the lower ground wire W of the transmission board 10.

The second guard ring structure 38b is connected to the upper ground wire W. In the second guard ring structure 38b, one ends of the first guard ring part 35a and the second guard ring part 35b are connected to each other, and the one ends of the first guard ring part 35a and the second guard ring part 35b are connected to the upper ground wire W of the transmission board 10.

When ground noise currents are generated, in the first guard ring structure 38a and the second guard ring structure 38b, currents flow through the first guard ring part 35a and the second guard ring part 35b in the directions opposite to each other. This cancels the induction electric fields.

Fifth Embodiment

Figure 12:
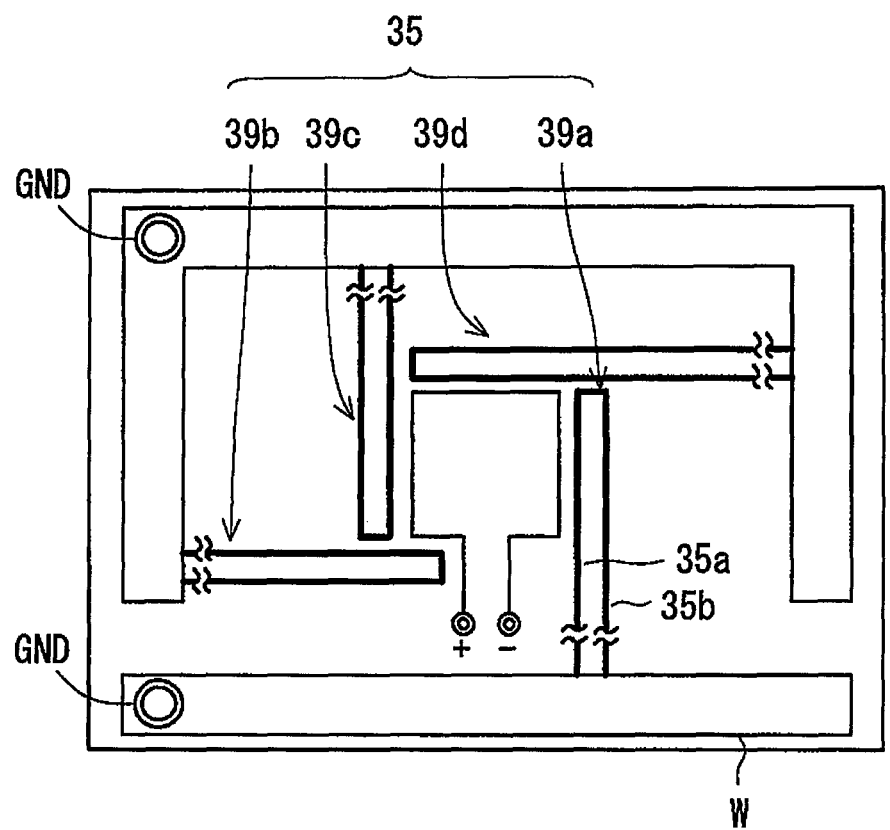
FIG. 12 is a drawing showing a part of a configuration of an apparatus according to a fifth embodiment.

An apparatus according to a fifth embodiment will be explained by referring to FIG. 12. FIG. 12 is a drawing showing a part of a configuration of the apparatus according to the fifth embodiment. FIG. 12 shows only the transmission board 10 as viewed from the top.

In the fifth embodiment, the double guard ring 35 includes a first guard ring structure 39a, a second guard ring structure 39b, a third guard ring structure 39c, and a fourth guard ring structure 39d. That is, the double guard ring 35 according to the fifth embodiment is divided into four parts. The transmission inductor 31 is surrounded by the first to fourth guard ring structures 39a to 39d.

The first to fourth guard ring structures 39a to 39d each include the first guard ring part 35a and the second guard ring part 35b. In the example shown in FIG. 12, the ground wire W that is extended in the horizontal direction is provided at the lower part of the transmission board 10. Further, the U-shaped ground wire W is provided along an upper end side, a right end side, and a left end side of the transmission board 10. The first guard ring structure 39a is connected to the lower ground wire W of the transmission board 10. The second to fourth guard ring structures 39b to 39d are connected to the U-shaped ground wire W.

In the first to fourth guard ring structures 39a to 39d, one ends of the first guard ring part 35a and the second guard ring part 35b are connected to each other, and the one ends of the first guard ring part 35a and the second guard ring part 35b are connected to the ground wire W.

When ground noise currents are generated, in the first to fourth guard ring structures 39a to 39d, currents flow through the first guard ring part 35a and the second guard ring part 35b in the directions opposite to each other. This cancels the induction electric fields.

Sixth Embodiment

Figure 13:
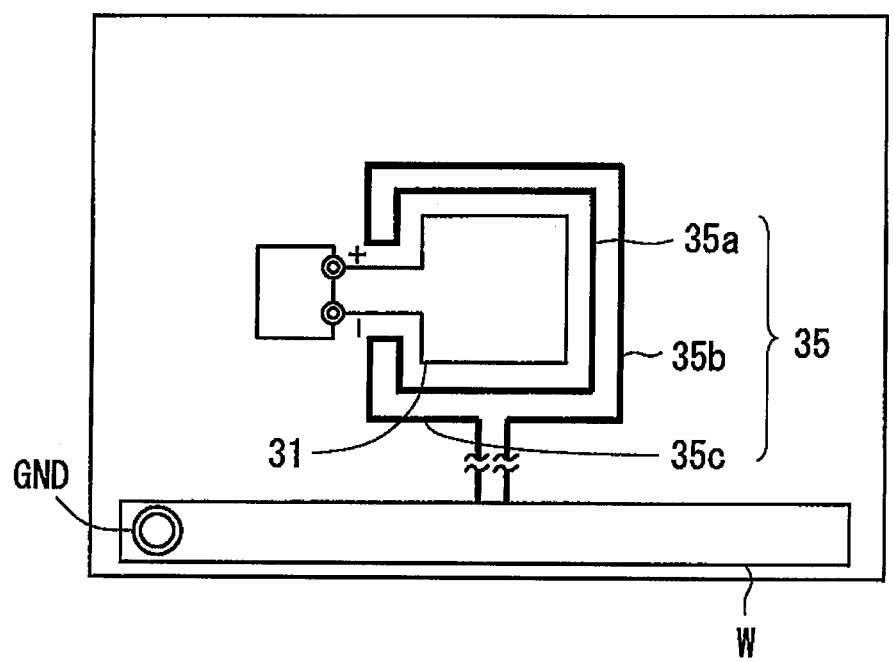
FIG. 13 is a drawing showing a part of another configuration of an apparatus according to a sixth embodiment.

An apparatus according to a sixth embodiment will be explained by referring to FIG. 13. FIG. 13 is a drawing showing a part of a configuration of the apparatus according to the sixth embodiment. FIG. 13 shows only the transmission board 10 as viewed from the top. FIG. 13 shows an example of a layout of a single-layer board in which a metal layer is formed only on the front surface of the transmission board 10.

As shown in FIG. 13, the transmission inductor 31 is provided on the first surface of the transmission board 10. Further, the transmission chip 30 is disposed on the surface where the transmission inductor 31 of the transmission board 10 is disposed. The transmission chip 30 and the transmission inductor 31 are arranged to align in a direction parallel to a direction to which the ground wire W is extended. The transmission inductor 31 and the transmission chip 30 are connected by the metal layer on the front surface of the transmission board 10. Note that as in the first embodiment, the transmission chip 30 may be disposed on the rear surface of the transmission board 10.

The double guard ring 35 includes the first guard ring part 35a, the second guard ring part 35b, and a third guard ring part 35c. The first guard ring part 35a surrounds the transmission inductor 31 in a planar view. A predetermined gap is provided between the ends of the first guard ring part 35a. The ends of the first guard ring part 35a are arranged to sandwich wires for connecting the transmission chip 30 and the transmission inductor 31.

The second guard ring part 35b and the third guard ring part 35c are disposed to be adjacent to an outer side of the first guard ring part 35a. The first guard ring part 35a is surrounded by the second guard ring part 35b and the third guard ring part 35c in a planar view.

One ends of the second guard ring part 35b and the third guard ring part 35c are connected to the ground wire W. The ground wire W is formed of a metal layer that is formed on the front surface of the transmission board 10. The one ends of the second guard ring part 35b and the third guard ring part 35c are connected to the ground terminal GND through the ground wire W.

One end of the first guard ring part 35a is connected to the other end of the second guard ring part 35b, and the other end of the first guard ring part 35a is connected to the other end of the third guard ring part 35c. The wires for connecting the transmission chip 30 and the transmission inductor 31 are provided between the both ends of the first guard ring part 35a.

When currents flow in a first direction of the first guard ring part 35a due to noise, currents flow in a second direction, which is a direction opposite to the first direction, through the second guard ring part 35b and the third guard ring part 35c. As described above, in the sixth embodiment, a connection point in the double guard ring 35 to the ground wire W can be one place.

Figure 14:
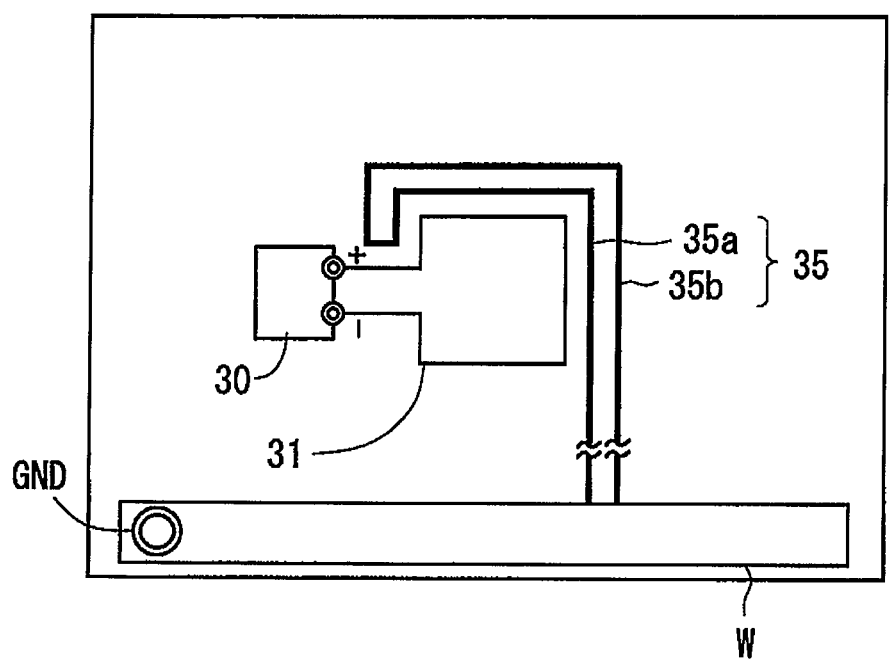
FIG. 14 is a drawing showing a part of another configuration of an apparatus according to the sixth embodiment.

Note that the double guard ring 35 can be configured as shown in FIG. 14. In the example shown in FIG. 14, as in FIG. 13, the transmission chip 30 and the transmission inductor 31 are arranged to align in a direction parallel to a direction to which the ground wire W is extended. The transmission inductor 31 and the transmission chip 30 are connected by the metal layer on the front surface of the transmission board 10.

The double guard ring 35 includes a first guard ring part 35a and a second guard ring part 35b. Both the first guard ring part 35a and the second guard ring part 35b are substantially L-shaped. One ends of the first guard ring part 35a and the second guard ring part 35b are connected to the ground wire W. The other end of the first guard ring part 35a is connected to the other end of the second guard ring part 35b. A connection point of the first guard ring part 35a and the second guard ring part 35b is disposed near a connection point of the transmission inductor 31 and the transmission chip 30.

Note that in the example shown in FIG. 14, the double guard ring 35 is not disposed on a side of the ground wire W of the transmission inductor 31. However, the connection point of the first guard ring part 35a and the second guard ring part 35b and the ground wire W may be moved to a position between the transmission inductor 31 and the ground wire W, and the first guard ring part 35a and the second guard ring part 35b may be disposed between the transmission inductor 31 and the ground wire W.

Seventh Embodiment

Figure 15:
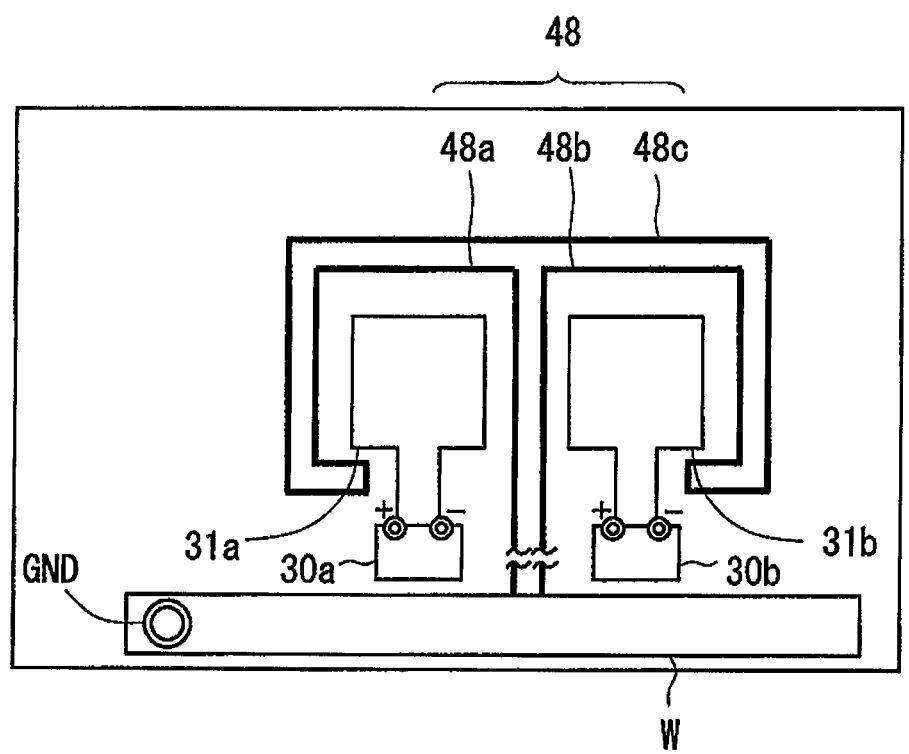
FIG. 15 is a drawing showing a part of another configuration of an apparatus according to a seventh embodiment.

An apparatus according to a seventh embodiment will be explained by referring to FIG. 15. FIG. 15 is a drawing showing a part of a configuration of the apparatus according to the seventh embodiment. FIG. 15 shows only the transmission board 10 as viewed from the top. FIG. 15 shows an example of a layout of a single-layer board in which a metal layer is formed only on the front surface of the transmission board 10.

As shown in FIG. 15, in the seventh embodiment, a first transmission inductor 31a and a second transmission inductor 31b are arranged to be adjacent to each other on the first surface of the transmission board 10. A direction in which the first transmission inductor 31a and the second transmission inductor 31b are aligned is parallel to a direction to which the ground wire W is extended. A first transmission chip 30a and a second transmission chip 30b are disposed on the surface on which the transmission inductor 31 of the transmission board 10 is provided. A direction in which the first transmission chip 30a and the second transmission chip 30b are aligned is parallel to the direction to which the ground wire W is extended.

The first transmission inductor 31a is connected to the first transmission chip 30a, and the second transmission inductor 31b is connected to the second transmission chip 30b. The first transmission chip 30a and the first transmission inductor 31a are arranged to align in a direction that is vertical to the direction to which the ground wire W is extended. Further, the second transmission chip 30b and the second transmission inductor 31b are arranged to align in a direction that is vertical to the direction to which the ground wire W is extended.

A connection between the first transmission inductor 31a and the first transmission chip 30a and a connection between the second transmission inductor 31b and the second transmission chip 30b are established by the metal layer on the front surface of the transmission board 10. Note that in a manner similar to that of the first embodiment, the first transmission chip 30a and the second transmission chip 30b may be disposed on the rear surface of the transmission board 10.

A double guard ring 48 includes a first guard ring part 48a, a second guard ring part 48b, and a third guard ring part 48c. The first guard ring part 48a surrounds the first transmission inductor 31a in planar view. A predetermined gap is provided between both ends of the first guard ring part 48a. The second guard ring part 48b surrounds the second transmission inductor 31b in planar view. A predetermined gap is provided between both ends of the second guard ring part 48b. The first guard ring part 48a and the second guard ring part 48b are disposed between the first transmission inductor 31a and the second transmission inductor 31b that are adjacent to each other.

The third guard ring part 48c is disposed to be adjacent to outer sides of the first guard ring part 48a and the second guard ring part 48b. The third guard ring part 48c surrounds the first guard ring part 48a and the second guard ring part 48b in planar view. The ground wire W is connected to one ends of the first guard ring part 48a and the second guard ring part 48b. The one ends of the first guard ring part 48a and the second guard ring part 48b are connected to the ground terminal GND through the ground wire W.

One end of the third guard ring part 48c is connected to the other end of the first guard ring part 48a, and the other end of the third guard ring part 48c is connected to the other end of the second guard ring part 48b. The wire for connecting the first transmission chip 30a to the first transmission inductor 31a is provided between both ends of the first guard ring part 48a. Further, the wire for connecting the second transmission chip 30b to the second transmission inductor 31b is provided between the both ends of the second guard ring part 48b.

When currents flow in a first direction of the third guard ring part 35c due to noise, currents flow in a second direction, which is a direction opposite to the first direction, through the first guard ring part 35a and the second guard ring part 35b. Further, currents flow through the first guard ring part 35a and the second guard ring part 35b between the first transmission inductor 31a and the second transmission inductor 31b in directions opposite to each other. As has been explained, in the seventh embodiment, even when a plurality of inductors are provided, a connection point in the double guard ring 48 to the ground wire W can be one place.

As has been explained so far, according to the embodiments, in the apparatus including the board on which the inductors are formed, it is possible to effectively shield against digital spurious and ground noise. The apparatuses according to the above embodiment can be used in a system that performs high-speed communication by non-contact coupling at a communication speed of Gbps. The board is not limited to a printed circuit board and may be a flexible printed circuit board. Note that in the third embodiment, a configuration not including the capacitors 36 and 46 can be employed.

Although the invention carried out by the present inventor has been explained in detail based on the embodiments, it is obvious that the present invention is not limited to the embodiments that have been already explained, and various modifications can be made without departing from the scope of the invention.

(Supplementary Note 1)
An apparatus comprising:
a board;
an inductor configured to be provided on the board;
a guard ring configured to include a first guard ring part provided to be adjacent to a circumference of the inductor and a second guard ring part provided to be adjacent to an outer side of the first guard ring part, one end of the second guard ring part being connected to one end of the first guard ring part; and
a first power supply configured to be connected to another end of the first guard ring part and another end of the second guard ring part.

(Supplementary Note 2)
The apparatus according to Supplementary note 1, wherein
the guard ring surrounds the inductor in planar view.

(Supplementary Note 3)
The apparatus according to Supplementary note 1, further comprising:
a capacitor configured to be provided between the first guard ring part and the second guard ring part.

(Supplementary Note 4)
The apparatus according to Supplementary note 1, further comprising:
a single guard ring configured to be connected to the first power supply and provided to be adjacent to an outer side of the second guard ring part.

(Supplementary Note 5)
The apparatus according to Supplementary note 4, wherein
the single guard ring surrounds the guard ring in planar view.

(Supplementary Note 6)
The apparatus according to Supplementary note 1, wherein
the guard ring includes a first guard ring structure and a second guard ring structure,
the first guard ring structure and the second guard ring structure each include the first guard ring part and the second guard ring part, and
the inductor is surrounded by the first guard ring structure and the second guard ring structure.

(Supplementary Note 7)
The apparatus according to Supplementary note 1, wherein
the guard ring includes a first guard ring structure, a second guard ring structure, a third guard ring structure, and a fourth guard ring structure,
the first guard ring structure, the second guard ring structure, the third guard ring structure, and the fourth guard ring structure each include the first guard ring part and the second guard ring part, and
the inductor is surrounded by the first guard ring structure, the second guard ring structure, the third guard ring structure, and the fourth guard ring structure.

(Supplementary Note 8)
The apparatus according to Supplementary note 1, wherein
the apparatus includes a first metal layer that is formed on a first surface of the board and a second metal layer that is formed on a second surface that is a rear surface of the first surface, and
the guard ring and a power supply wire for connecting the guard ring to the first power supply are formed of the first metal layer.

(Supplementary Note 9)
The apparatus according to Supplementary note 8, further comprising:
a chip configured to be disposed on the second surface and exchange a signal with the inductor, wherein
a wire connected to the chip is formed of the second metal layer, and
the wire is connected to the inductor through a via formed on the board.

(Supplementary Note 10)
The apparatus according to Supplementary note 1, wherein
the inductor contactlessly transmits a differential mode signal and a common mode signal at the same time to an opposing apparatus by non-contact coupling with an opposing inductor that is provided in the opposing apparatus disposed to face the apparatus.

(Supplementary Note 11)
The apparatus according to Supplementary note 10, wherein
the apparatus is a transmission unit including a differential mode transmitter that supplies a differential mode signal to the inductor and a common mode transmitter that supplies a common mode signal to the inductor or a reception unit including a differential mode receiver that receives the differential mode signal from the inductor and a common mode receiver that receives the common mode signal from the inductor, and
the apparatus further comprises:
an analog ground configured to be connected to the differential mode transmitter or the differential mode receiver; and
a digital ground configured to be connected to the common mode transmitter or the common mode receiver.

(Supplementary Note 12)

The apparatus according to Supplementary note 1, wherein the board is a printed circuit board or a flexible printed circuit board.

(Supplementary Note 13)

An apparatus comprising:

a board;

an inductor configured to be disposed on the board;

a first guard ring part configured to be provided to surround the inductor in planar view and pass a current in a first direction, one end of the first guard ring part being connected to a first power supply, and a second guard ring part configured to be connected to another end of the first guard ring part, provided to surround the first guard ring part in planar view, and pass a current in a second direction, the second direction being opposite to the first direction.

(Supplementary Note 14)

A system comprising:

a first apparatus according to any one of Supplementary notes 1 to 13, and a second apparatus configured to include an opposing inductor that is disposed to face the inductor so as to form non-contact coupling and perform non-contact communication.

(Supplementary Note 15)

A system comprising:

a first apparatus comprising:

an inductor configured to be formed on a board and connected to a chip, the chip being disposed on the board;

a guard ring configured to include a first guard ring part and a second guard ring part and surround the inductor in planar view, the first guard ring part being provided to be adjacent to a circumference of the inductor, one end of the second guard ring part being connected to one end of the first guard ring part, and the second guard ring part being provided to be adjacent to an outer side of the first guard ring; and a power supply configured to be connected to another end of the first guard ring part and another end of the second guard ring part; and a second apparatus configured to include an opposing inductor, the opposing inductor being disposed to face the inductor so as to form non-contact coupling and perform non-contact communication.

(Supplementary Note 16)

The system according to Supplementary note 15, wherein the first apparatus comprises:

the inductor configured to be formed of a first metal layer formed on a first surface of the board; and the chip configured to be disposed on a second surface that is a rear surface of the board and connected to a second metal layer that is formed on the second surface.

(Supplementary Note 17)

The system according to Supplementary note 15, wherein the first apparatus further comprises:

a differential mode transmitter configured to supply a differential mode signal to the inductor and a common mode transmitter configured to supply a common mode signal to the inductor; and an analog ground configured to be connected to the differential mode transmitter and a digital ground configured to be connected to the common mode transmitter, wherein the first apparatus is disposed to face the opposing inductor so as to form non-contact coupling and perform non-contact communication with the second apparatus.

(Supplementary Note 18)

The system according to Supplementary note 15, wherein the first apparatus and the second apparatus each further include an antenna coil that performs RFID communication.

(Supplementary Note 19)

The system according to Supplementary note 15, wherein the first apparatus includes a power transmitting unit that contactlessly transmits power, and the second apparatus includes a power receiving unit that contactlessly receives the power transmitted from the power transmitting unit.

(Supplementary Note 20)

The system according to Supplementary note 15, further comprising:

a capacitor configured to be provided between the first guard ring part and the second guard ring part.

(Supplementary Note 21)

The apparatus according to Supplementary note 15, further comprising:

a single guard ring configured to be connected to the power supply and provided to be adjacent to an outer side of the second guard ring part.

(Supplementary Note 22)

The apparatus according to Supplementary note 21, wherein the single guard ring surrounds the guard ring in planar view.

(Supplementary Note 23)

The system according to Supplementary note 15, wherein the guard ring includes a first guard ring structure and a second guard ring structure, the first guard ring structure and the second guard ring structure each include the first guard ring part and the second guard ring part, and the inductor is surrounded by the first guard ring structure and the second guard ring structure.

(Supplementary Note 24)

The system according to Supplementary note 15, wherein the guard ring includes a first guard ring structure, a second guard ring structure, a third guard ring structure, and a fourth guard ring structure, the first guard ring structure, the second guard ring structure, the third guard ring structure, and the fourth guard ring structure each include the first guard ring part and the second guard ring part, and the inductor is surrounded by the first guard ring structure, the second guard ring structure, the third guard ring structure, and the fourth guard ring structure.

(Supplementary Note 25)

An apparatus comprising:

a board;

an inductor configured to be provided on the board;

a guard ring configured to include a first guard ring part provided to be adjacent to a circumference of the inductor and a second guard ring part and a third guard ring part provided to be adjacent to an outer side of the first guard ring part; and a first power supply configured to be connected to one ends of the second guard ring part and the third guard ring part, wherein one end of the first guard ring part is connected to another end of the second guard ring part, and another end of the first guard ring part is connected to another end of the third guard ring part.

(Supplementary Note 26)

The apparatus according to Supplementary note 25, wherein the first guard ring part surrounds the inductor in planar view, and the second guard ring part and the third guard ring part surround the first guard ring part in planar view.

(Supplementary Note 27)

The apparatus according to Supplementary note 25, further comprising:

a chip configured to be disposed on a surface of the board on which the inductor is formed and connected to the inductor.

(Supplementary Note 28)

The apparatus according to Supplementary note 26, wherein the chip is connected to the inductor by a wire provided between the one end and the other end of the first guard ring part.

(Supplementary Note 29)

An apparatus comprising:

a board;

a first inductor and a second inductor configured to be provided on the same surface of the board;

a guard ring configured to include a first guard ring part provided to be adjacent to a circumference of the first inductor and a second guard ring part provided to be adjacent to a circumference of the second inductor, and a third guard ring part provided to be adjacent to outer sides of the first guard ring part and the second guard ring part; and a first power supply configured to be connected to one ends of the first guard ring part and the second guard ring part, wherein one end of the third guard ring part is connected to another end of the first guard ring part, and another end of the third guard ring part is connected to another end of the second guard ring part.

(Supplementary Note 30)

The apparatus according to Supplementary note 29, wherein the first guard ring part surrounds the first inductor in planar view, the second guard ring part surrounds the second inductor in planar view, and the third guard ring part surrounds the first guard ring part and the second guard ring part in planar view.

(Supplementary Note 31)

The apparatus according to Supplementary note 29, further comprising:

a first chip and a second chip configured to be disposed on a surface of the board on which the first inductor and the second inductor are formed and connected to the first inductor and the second inductor, respectively.

(Supplementary Note 32)

The apparatus according to Supplementary note 1, further comprising:

a chip configured to be disposed on a surface of the board on which the inductor is formed and connected to the inductor.

The first to seven embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An apparatus comprising:
a board;
an inductor configured to be provided on the board;
a guard ring configured to include a first guard ring part provided to be adjacent to a circumference of the inductor and a second guard ring part provided to be adjacent to an outer side of the first guard ring part, one end of the second guard ring part being connected to one end of the first guard ring part; and
a first power supply configured to be connected to another end of the first guard ring part and another end of the second guard ring part,
wherein the first guard ring part defines a first current path and the second guard ring part defines a second current path, and
wherein a direction of the second current path is opposite to a direction of the first current path.

2. The apparatus according to claim 1, wherein
the guard ring surrounds the inductor in a planar view.

3. The apparatus according to claim 1, further comprising:
a capacitor configured to be provided between the first guard ring part and the second guard ring part.

4. The apparatus according to claim 1, further comprising:
a single guard ring configured to be connected to the first power supply and provided to be adjacent to an outer side of the second guard ring part.

5. The apparatus according to claim 4, wherein
the single guard ring surrounds the guard ring in a planar view.

6. The apparatus according to claim 1, wherein
the guard ring includes a first guard ring structure and a second guard ring structure,
the first guard ring structure and the second guard ring structure each include the first guard ring part and the second guard ring part, and
the inductor is surrounded by the first guard ring structure and the second guard ring structure.

7. The apparatus according to claim 1, wherein
the guard ring includes a first guard ring structure, a second guard ring structure, a third guard ring structure, and a fourth guard ring structure,
the first guard ring structure, the second guard ring structure, the third guard ring structure, and the fourth guard ring structure each include the first guard ring part and the second guard ring part, and
the inductor is surrounded by the first guard ring structure, the second guard ring structure, the third guard ring structure, and the fourth guard ring structure.

8. The apparatus according to claim 1, wherein
the apparatus includes a first metal layer that is formed on a first surface of the board and a second metal layer that is formed on a second surface that is a rear surface of the first surface, and
the guard ring and a power supply wire for connecting the guard ring to the first power supply are formed of the first metal layer.

9. The apparatus according to claim 8, further comprising:
a chip configured to be disposed on the second surface and exchanges a signal with the inductor, wherein
a wire connected to the chip is formed of the second metal layer, and the wire is connected to the inductor through a via formed on the board.

10. The apparatus according to claim 1, wherein
the inductor contactlessly transmits a differential mode signal and a common mode signal at the same time to an opposing apparatus by non-contact coupling with an opposing inductor that is provided in the opposing apparatus disposed to face the apparatus.

11. The apparatus according to claim 10, wherein
the apparatus is a transmission unit including a differential mode transmitter that supplies a differential mode signal to the inductor and a common mode transmitter that supplies a common mode signal to the inductor or a reception unit including a differential mode receiver that receives the differential mode signal from the inductor and a common mode receiver that receives the common mode signal from the inductor, and
the apparatus further comprises:
    an analog ground configured to be connected to the differential mode transmitter or the differential mode receiver; and
    a digital ground configured to be connected to the common mode transmitter or the common mode receiver.

12. The apparatus according to claim 1, wherein the board is a printed circuit board or a flexible printed circuit board.

13. An apparatus comprising:
a board;
an inductor configured to be disposed on the board;
a first guard ring part configured to be provided to surround the inductor in a planar view and define a first current path in a first direction, one end of the first guard ring part being connected to a power supply, and
a second guard ring part configured to be connected to another end of the first guard ring part and the other end of the second guard ring part being connected to the power supply, the second guard ring part being provided to surround the first guard ring part in a planar view, and define a second current path in a second direction, where the second direction is opposite to the first direction.

14. A system comprising:
a first apparatus including:
    an inductor configured to be formed on a board and connected to a chip, the chip being disposed on the board;
    a guard ring configured to include a first guard ring part and a second guard ring part and surround the inductor in a planar view, the first guard ring part being provided to be adjacent to a circumference of the inductor, one end of the second guard ring part being connected to one end of the first guard ring part, and the second guard ring part being provided to be adjacent to an outer side of the first guard ring; and
    a power supply configured to be connected to another end of the first guard ring part and another end of the second guard ring part; and
a second apparatus including an opposing inductor, the opposing inductor being disposed to face the inductor so as to form non-contact coupling and perform non-contact communication,
wherein the first guard ring part defines a first current path and the second guard ring part defines a second current path, and
wherein a direction of the second current path is opposite to a direction of the first current path.

15. The system according to claim 14, wherein
the first apparatus includes:
    the inductor configured to be formed of a first metal layer formed on a first surface of the board; and
    the chip configured to be disposed on a second surface that is a rear surface of the board and connected to a second metal layer that is formed on the second surface.

16. The system according to claim 14, wherein
the first apparatus further includes:
    a differential mode transmitter configured to supply a differential mode signal to the inductor and a common mode transmitter configured to supply a common mode signal to the inductor; and
    an analog ground configured to be connected to the differential mode transmitter and a digital ground configured to be connected to the common mode transmitter, wherein
the first apparatus is disposed to face the opposing inductor so as to form non-contact coupling and perform non-contact communication with the second apparatus.

17. The system according to claim 14, wherein
the first apparatus and the second apparatus each further include an antenna coil that performs RFID communication.

18. The system according to claim 14, wherein
the first apparatus includes a power transmitting unit that contactlessly transmits power, and
the second apparatus includes a power receiving unit that contactlessly receives the power transmitted from the power transmitting unit.

* * * * *